United States Patent
Kong et al.

(10) Patent No.: US 11,990,500 B2
(45) Date of Patent: May 21, 2024

(54) MICRO LIGHT EMITTING DISPLAY APPARATUS AND METHOD OF MANUFACTURING THE SAME

(71) Applicant: SAMSUNG ELECTRONICS CO., LTD., Suwon-si (KR)

(72) Inventors: Kiho Kong, Suwon-si (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 17/207,105

(22) Filed: Mar. 19, 2021

(65) Prior Publication Data

US 2022/0109021 A1   Apr. 7, 2022

(30) Foreign Application Priority Data

Oct. 5, 2020   (KR) ........................ 10-2020-0128270

(51) Int. Cl.
| | |
|---|---|
| *H01L 27/15* | (2006.01) |
| *G09G 3/32* | (2016.01) |
| *H01L 33/00* | (2010.01) |
| *H01L 33/38* | (2010.01) |
| *H01L 33/62* | (2010.01) |

(52) U.S. Cl.
CPC ............ *H01L 27/156* (2013.01); *G09G 3/32* (2013.01); *H01L 33/005* (2013.01); *H01L 33/38* (2013.01); *H01L 33/62* (2013.01); *H01L 2933/0016* (2013.01); *H01L 2933/0066* (2013.01)

(58) Field of Classification Search
CPC ..... H01L 27/156; H01L 33/005; H01L 33/62; H01L 33/38; H01L 2933/0016; H01L 25/0753; H01L 25/167; H01L 2933/0066; H01L 33/025; H01L 33/44; G09G 3/32
See application file for complete search history.

(56) References Cited

U.S. PATENT DOCUMENTS

| | | |
|---|---|---|
| 7,381,504 B2 | 6/2008 | Kawaguchi et al. |
| 8,441,018 B2 | 5/2013 | Lee et al. |
| 8,669,574 B2 | 3/2014 | Konsek et al. |
| 9,257,605 B2 | 2/2016 | Seo et al. |

(Continued)

FOREIGN PATENT DOCUMENTS

| | | |
|---|---|---|
| EP | 3 373 334 A1 | 9/2018 |
| KR | 10-1308203 B1 | 9/2013 |

(Continued)

OTHER PUBLICATIONS

Communication dated Dec. 14, 2021, issued by the European Patent Office in counterpart European Application No. 21180129.5.

*Primary Examiner* — Meiya Li
(74) *Attorney, Agent, or Firm* — Sughrue Mion, PLLC

(57) ABSTRACT

A micro light emitting display apparatus and a method of manufacturing the micro light emitting display apparatus are disclosed. The micro light emitting display apparatus includes a micro light emitting element, a driving transistor connected to the micro light emitting element, a switching transistor connected to the driving transistor, and a first opening is provided to expose a source region or a drain region of the switching transistor, and a gate electrode of the driving transistor is provided in the first opening and in contact with the source region or the drain region of the switching transistor.

16 Claims, 30 Drawing Sheets

(56) References Cited

U.S. PATENT DOCUMENTS

| | | |
|---|---|---|
| 9,484,492 B2 | 11/2016 | Bour et al. |
| 9,595,637 B2 | 3/2017 | Kum et al. |
| 9,601,659 B2 | 3/2017 | Bour et al. |
| 2006/0238135 A1* | 10/2006 | Kimura .................... G09G 3/20 |
| | | 315/169.3 |
| 2007/0001205 A1* | 1/2007 | Kimura ................ H01L 27/124 |
| | | 257/296 |
| 2007/0012970 A1* | 1/2007 | Mouli ............... H01L 27/14689 |
| | | 257/292 |
| 2007/0275624 A1 | 11/2007 | Kawaguchi et al. |
| 2009/0322214 A1 | 12/2009 | Lee et al. |
| 2016/0126293 A1 | 5/2016 | Li et al. |
| 2018/0190744 A1 | 7/2018 | Oh et al. |
| 2018/0277713 A1 | 9/2018 | Ciechonski et al. |
| 2018/0287027 A1 | 10/2018 | Chaji |
| 2018/0323347 A1 | 11/2018 | Liu |
| 2019/0305188 A1 | 10/2019 | Lauermann et al. |
| 2020/0111815 A1* | 4/2020 | Lius ...................... G06F 3/0412 |
| 2020/0152693 A1 | 5/2020 | Zou et al. |

FOREIGN PATENT DOCUMENTS

| | | |
|---|---|---|
| KR | 10-1878666 B1 | 8/2018 |
| KR | 10-2022310 B1 | 9/2019 |

\* cited by examiner

MICRO LIGHT EMITTING DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2020-0128270, filed on Oct. 5, 2020, in the Korean Intellectual Property Office, the disclosure of which is incorporated by reference herein in its entirety.

BACKGROUND

1. Field

Example embodiments relate to a micro light emitting display apparatus and a method of manufacturing the micro light emitting display apparatus.

2. Description of the Related Art

Liquid crystal displays (LCDs) and organic light emitting diode (OLED) displays are widely used as display apparatuses. Recently, a technology for manufacturing high-resolution display apparatuses using micro light emitting diodes (LEDs) has been in the spotlight. LEDs have the advantages of being eco-friendly and low power consumption, and as such, industrial demand therefor is increasing.

For example, in addition to LEDs being used for illumination apparatuses or LCD backlights, display apparatuses using micro LED chips have been developed. Moreover, according to the demand for large area and high resolution display apparatuses, the number of micro light emitting elements used for the display apparatuses has increased, and sizes of the micro light emitting elements have been reduced.

SUMMARY

An example embodiment provides a micro light emitting display apparatus.

An example embodiment provides a method of manufacturing a micro light emitting display apparatus.

Additional aspects will be set forth in part in the description which follows and, in part, will be apparent from the description, or may be learned by practice of the presented embodiments of the disclosure.

According to an aspect of the disclosure, there is provided a micro light emitting display apparatus, comprising: a micro light emitting element; a driving transistor connected to the micro light emitting element; a switching transistor connected to the driving transistor; a capacitor connected to the driving transistor and the switching transistor; a first opening provided to expose a source region or a drain region of the switching transistor; and a gate electrode of the driving transistor extending into the first opening, and in contact with the source region or the drain region of the switching transistor.

The micro light emitting display apparatus further comprising: an insulating layer provided on the gate electrode of the driving transistor; and a first electrode of the capacitor provided on the insulating layer and arranged to face the gate electrode of the driving transistor.

The first electrode of the capacitor is a flat plate type electrode.

The gate electrode of the driving transistor and the first electrode of the capacitor face each other and are spaced apart from each other.

The source region or the drain region of the switching transistor includes an implantation region.

The micro light emitting element has a size of about 100 µm or less.

The micro light emitting display apparatus further comprising: an anode electrode provided in the micro light emitting element; a second opening provided to expose the anode electrode; and a metal line provided in the second opening.

The metal line includes a first portion provided inside the second opening and a second portion provided outside the second opening, and a drain region of the driving transistor is provided to be in contact with the first portion.

The second opening is configured to penetrate a drain region of the driving transistor.

The gate electrode of the driving transistor is commonly provided as a second electrode of the capacitor.

According to another aspect of the disclosure, there is provided a micro light emitting display apparatus comprising: a substrate; a micro light emitting element provided on the substrate; an anode electrode provided in the micro light emitting element; a driving transistor connected to the micro light emitting element; a switching transistor connected to a gate electrode of the driving transistor; a capacitor connected to the driving transistor and the switching transistor; a first opening configured to expose a surface of the anode electrode; and a metal line provided in the first opening, wherein the first opening penetrates a drain region of the driving transistor, the metal line provided in the first opening is in contact with the surface of the anode electrode, and the drain region of the driving transistor is in contact with a side surface of the metal line.

The micro light emitting element has a size of about 100 µm or less.

The metal line includes a first portion provided inside the first opening and a second portion provided outside the first opening, and the drain region of the driving transistor is in contact with a side surface of the first portion.

The micro light emitting display apparatus further comprising: an insulating layer provided on the gate electrode of the driving transistor; and a first electrode of the capacitor provided in the insulating layer.

The first electrode of the capacitor is a flat plate type electrode.

The gate electrode of the driving transistor and the first electrode of the capacitor face each other and are spaced apart from each other.

A source region or a drain region of the switching transistor includes an implantation region.

According to another aspect of the disclosure, there is provided a method of manufacturing a micro light emitting display apparatus, the method comprising: forming a micro light emitting element on a substrate; forming an anode electrode in the micro light emitting element, the anode electrode formed in a first layer on the substrate; forming a first active pattern and a second active pattern on a second layer above the first layer in which the anode electrode is formed, the first active pattern including a first source region and a first drain region of a driving transistor and the second active pattern including a second source region and a second drain region of a switching transistor; forming a first insulating layer on the first active pattern and the second active pattern; forming a first opening in the first insulating layer to expose the second source region or the second drain region of the switching transistor; and forming a gate electrode of the driving transistor in the first opening to be in contact with the second source region or the second drain region of the switching transistor.

The method further comprising: forming a second insulating layer on the gate electrode of the driving transistor; and forming a first electrode of a capacitor on the second insulating layer.

The first electrode of the capacitor is a flat plate electrode.

The gate electrode of the driving transistor and the first electrode of the capacitor face each other and are spaced apart from each other.

The method further comprising forming an implantation region in the second source region or the second drain region of the switching transistor before forming the first opening.

The micro light emitting element has a size of about 100 µm or less.

The method further comprising: forming a second opening to expose the anode electrode; and forming a metal line extending into the second opening.

The metal line includes a first portion provided inside the second opening and a second portion provided outside the second opening, and the first drain region of the driving transistor is in contact with the first portion.

The second opening penetrates the first drain region of the driving transistor.

According to another aspect of the disclosure, there is provided a micro light emitting device comprising: a light emitting element provided on a substrate; an anode electrode of the light emitting element provided on a first layer on the substrate; a first active pattern and a second active pattern provided on a second layer above the first layer in which the anode electrode is formed, the first active pattern including a first source region and a first drain region of a driving transistor and the second active pattern including a second source region and a second drain region of a switching transistor; a first insulating layer provided on the first active pattern and the second active pattern; a first opening in the first insulating layer configured to expose the second source region or the second drain region of the switching transistor; a gate electrode of the driving transistor provided in the first opening to be in contact with the second source region or the second drain region of the switching transistor; a second insulating layer provided on the gate electrode of the driving transistor; and a first electrode of a capacitor provided on the second insulating layer to face the gate electrode and spaced apart from the gate electrode.

According to another aspect of the disclosure, there is provided a micro light emitting device comprising: a light emitting element provided on a substrate; an anode electrode of the light emitting element provided on a first layer on the substrate; a first active pattern and a second active pattern provided on a second layer above the first layer in which the anode electrode is formed, the first active pattern including a first source region and a first drain region of a driving transistor and the second active pattern including a second source region and a second drain region of a switching transistor; a first insulating layer provided on the first active pattern and the second active pattern; a first opening configured to penetrate the first drain region of the driving transistor and expose the anode electrode; and a metal line provided in the first opening, the metal line includes a first portion provided inside the first opening and a second portion provided outside the first opening, and the first drain region of the driving transistor is in contact with the first portion.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
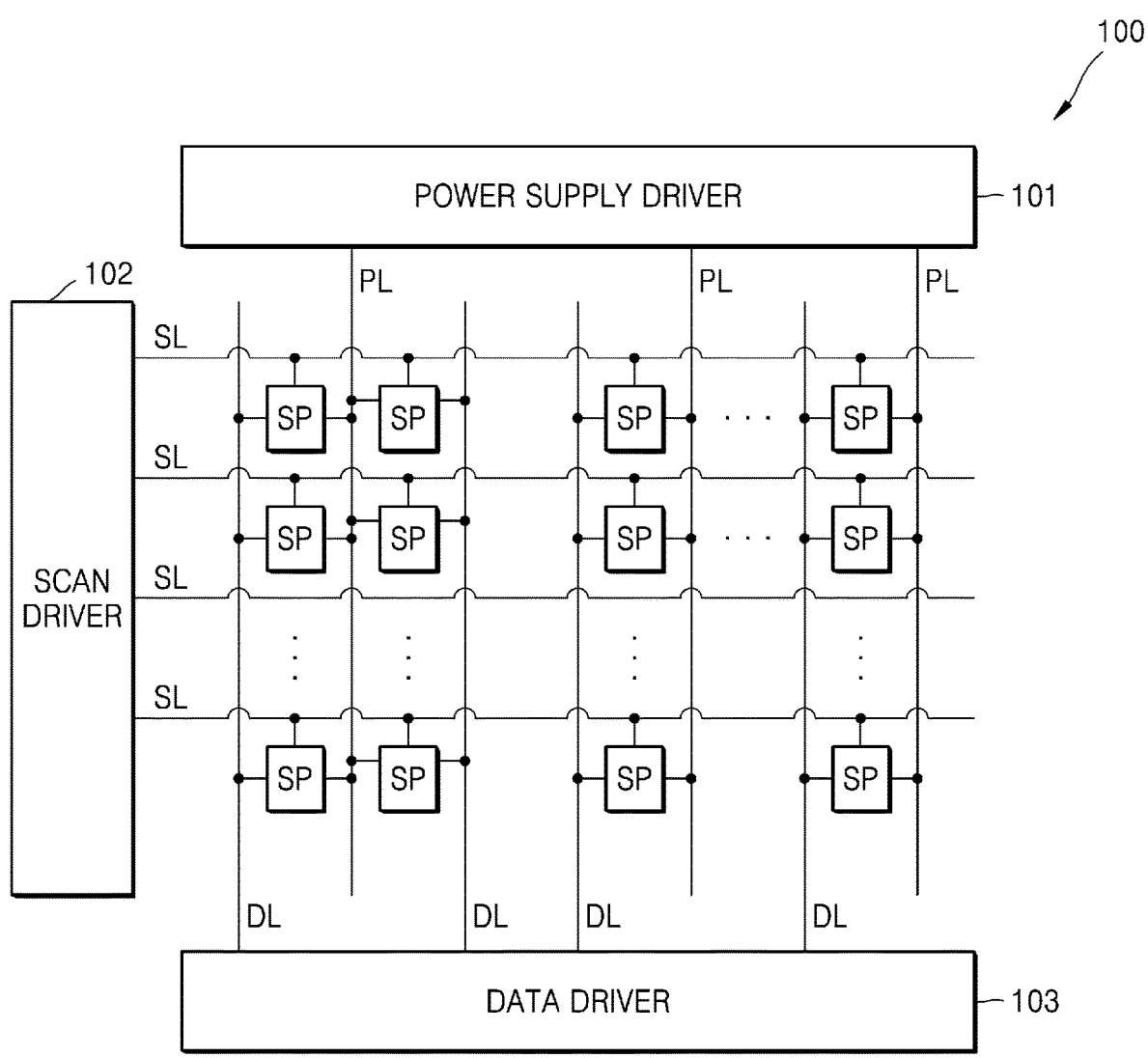
FIG. 1 schematically illustrates a micro light emitting display apparatus according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro light emitting display apparatus and a method of manufacturing the same according to various embodiments will be described in detail with reference to the accompanying drawings. In the drawings, like reference numerals refer to like elements, and a size of each element in the drawings may be exaggerated for clarity and convenience of description. The terms "first", "second", and so on may be used to describe various configuration elements but configuration elements should not be limited by terms. Terms are only used for the purpose of distinguishing one configuration element from another configuration element.

A singular expression includes plural expressions unless the context clearly indicates otherwise. In addition, when a part is described to "include" a certain configuration element, which means that the part may further include other configuration elements, except to exclude other configuration elements unless otherwise stated. In addition, in the drawings, a size or a thickness of each configuration element may be exaggerated for the sake of clear description. In addition, when it is described that a predetermined material layer is formed on a substrate or another layer, the material layer may also be formed in direct contact with the substrate or another layer, or a third layer may be formed therebetween. In addition, in the following examples, materials forming respective layers are examples, and other materials may be used.

In addition, terms such as "unit", "portion", and "module" described in the specification may indicate units that process at least one function or operation, which may be configured by hardware, software, or a combination of hardware and software.

Specific implementations described in the example embodiment are examples and do not limit the technical scope in any way. For the sake of brief specification, descriptions of electronic configurations of the related art, control systems, software, and other functional aspects of the systems may be omitted. In addition, connection or connection members of lines between configuration elements illustrated in the drawings exemplarily represent functional connections and/or physical or circuit connections, and may be represented as alternative or additional various functional connections, physical connections, or circuit connections in an actual apparatus.

Use of a term "above-described" and a similar reference term may correspond to both the singular and the plural.

Steps constituting a method are not limited in the order described and may be performed in any suitable order unless there is a clear statement that the steps should be performed in the order described. In addition, use of all exemplary terms ("for example" and "and so on") is merely for describing technical ideas in detail, and the scope of the claims are not limited to the terms unless limited by claims.

Figure 2:
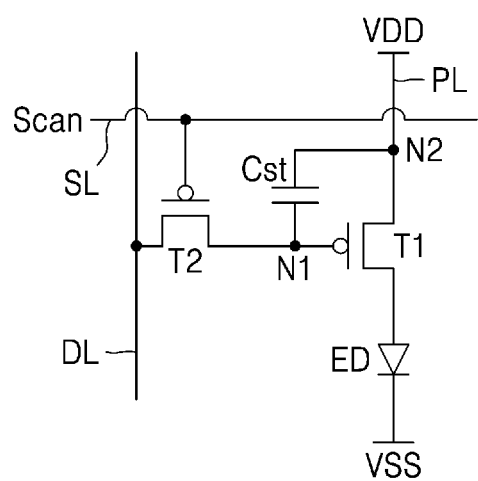
FIG. 2 is a circuit diagram of a micro light emitting display apparatus according to an example embodiment.

FIGS. 1 and 2 are equivalent circuit diagrams of a circuit for driving a micro light emitting display apparatus according to an embodiment.

A display apparatus 100 may include sub-pixels SP, a power supply driver 101, a scan driver 102, and a data driver 103.

Each of the sub-pixels SP may include a light emitting element that emits light of different wavelengths or emits light of one wavelength. The power supply driver 101 may supply voltages to the light emitting elements of the sub-pixels SP. The scan driver 102 may generate a scan signal for forming a channel of a switching transistor. The switching transistor may drive each of the sub-pixels SP to be on or off. The data driver 103 may generate a data signal for forming a channel of a driving transistor. The driving transistor may adjust brightness of the light emitting element by adjusting the amount of current supplied to each of the sub-pixels SP.

The sub-pixels SP may be arranged in, for example, a matrix form. Each of the sub-pixels SP may be provided in a region in which a scan line SL connected to the scan driver 102, a data line DL connected to the data driver 103, and a drive voltage line PL connected to the power supply driver 101 intersect with each other.

FIG. 2 illustrates an example of a circuit of the sub-pixel SP. Referring to FIG. 2, the sub-pixel SP may include a first transistor T1, a second transistor T2, a capacitor Cst, and a light emitting element ED. The first transistor T1 may be, for example, a driving transistor, and the second transistor T2 may be a switching transistor. However, the disclosure is not limited thereto. The switching transistor T2 may be connected to the scan line SL and the data line DL and may transmit a data signal inputted through the data line DL to the driving transistor T1 in response to the scan signal inputted through the scan line SL.

The capacitor Cst may be connected to the driving transistor T1 and the switching transistor T2. The capacitor Cst may be connected to the switching transistor T2 and the drive voltage line PL and may store a voltage corresponding to a difference between a voltage received from the switching transistor T2 and a drive voltage VDD supplied through the drive voltage line PL.

The driving transistor T1 may be connected to the drive voltage line PL and the capacitor Cst and may control a drive current flowing from the drive voltage line PL to a light emitting element ED according to the voltage value stored in the capacitor Cst. The driving transistor T1 may apply a voltage to the light emitting element ED. The light emitting element ED may include, for example, a micro light emitting element. The light emitting element ED may have a size of, for example, 200 µm or less. Alternatively, the light emitting element ED may have a size of, for example, 100 µm or less. The light emitting element ED may emit light having a predetermined luminance according to a drive current.

Although FIG. 2 illustrates a case in which a sub-pixel circuit includes two transistors and one capacitor, the disclosure is not limited thereto.

The driving transistor T1 may include a gate terminal connected to a first node N1, a second terminal connected to a second node N2, and a third terminal connected to the light emitting element ED. The second terminal may be, for example, a source terminal, and the third terminal may be a drain terminal. The switching transistor T2 may include a gate terminal connected to the scan line SL, a fourth terminal (for example, a drain terminal) connected to the data line DL, and a fifth terminal (for example, a source terminal) connected to the first node N1 (or a gate terminal of the driving transistor T1). The switching transistor T2 may be connected to the gate terminal of the driving transistor T1. The switching transistor T2 may be turned on according to a scan signal transmitted through the scan line SL and may perform a switching operation of transmitting a data signal transmitted to the data line DL to the first node N1. The capacitor Cst may include a first electrode connected to the first node N1 and a second electrode connected to the second node N2 (drive voltage line PL).

The light emitting element ED may include a pixel electrode and a common electrode facing the pixel electrode, and the common electrode may receive a common voltage VSS. The common voltage VSS may be, for example, a ground voltage. The light emitting element ED may display an image by receiving a drive current from the driving transistor T1 and emitting light of a predetermined color. The common electrode may be provided in common to a plurality of sub-pixels.

Although FIG. 2 illustrates P-type transistors as transistors of the pixel circuit, the embodiments of the disclosure are not limited thereto. For example, the transistors of the pixel circuit may be N-type transistors, or one of the transistors may be a P-type transistor and the other of the transistors may be an N-type transistor.

For example, an anode electrode (pixel electrode) of the light emitting element ED may be electrically connected to the drain terminal of the driving transistor T1. The amount of current of the driving transistor T1 may be controlled by a data signal applied through the switching transistor T2.

A cathode electrode (common electrode) of the light emitting element ED may be electrically connected to the ground voltage VSS. The light emitting element ED may generate light in response to a current provided from the driving transistor T1. For example, the light emitting element ED may include a micro LED.

The data line DL may receive a data signal from the data driver 103 and transmit the data signal to the subpixels SP. In this case, the data line DL may transmit the data signal to the subpixels SP in response to the scan signal. A luminance of the light emitting element ED of each of the sub-pixels SP may be controlled by the amount of current supplied from the drive voltage line PL to the ground voltage VSS via the light emitting element ED in response to the data signal.

Figure 3:
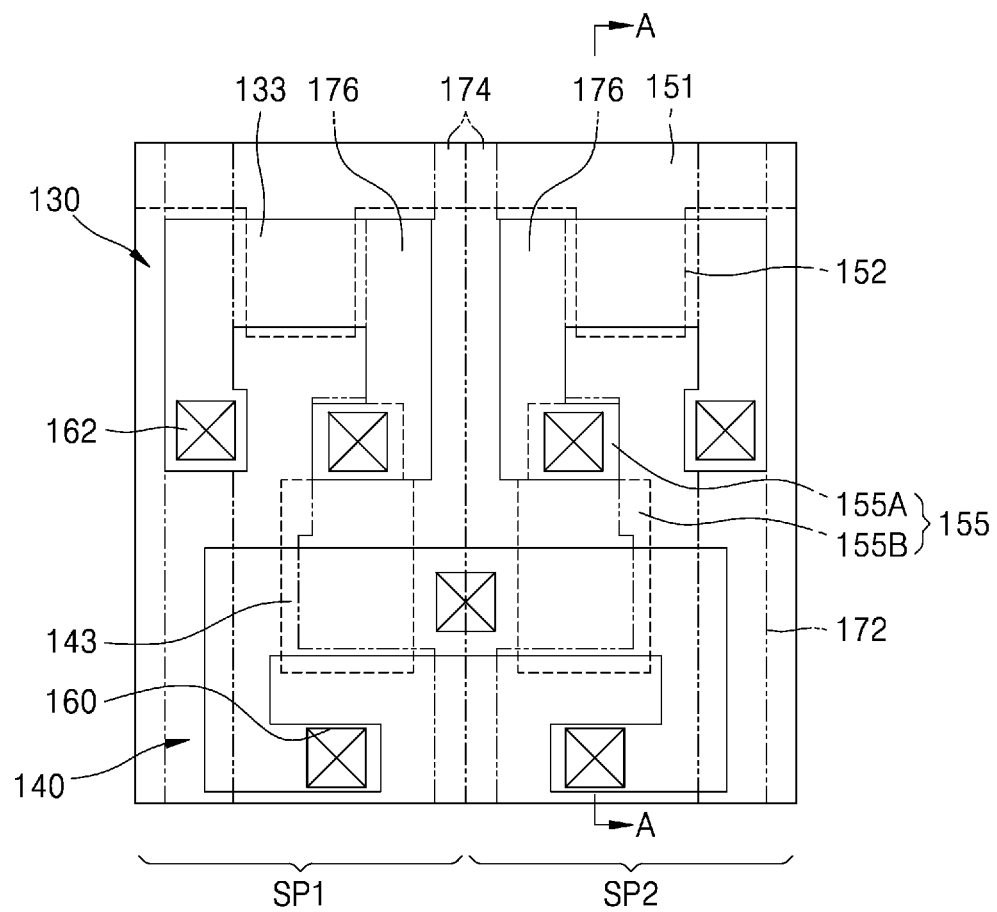
FIG. 3 illustrates a schematic circuit layout of a micro light emitting display apparatus according to an example embodiment.
Figure 4:
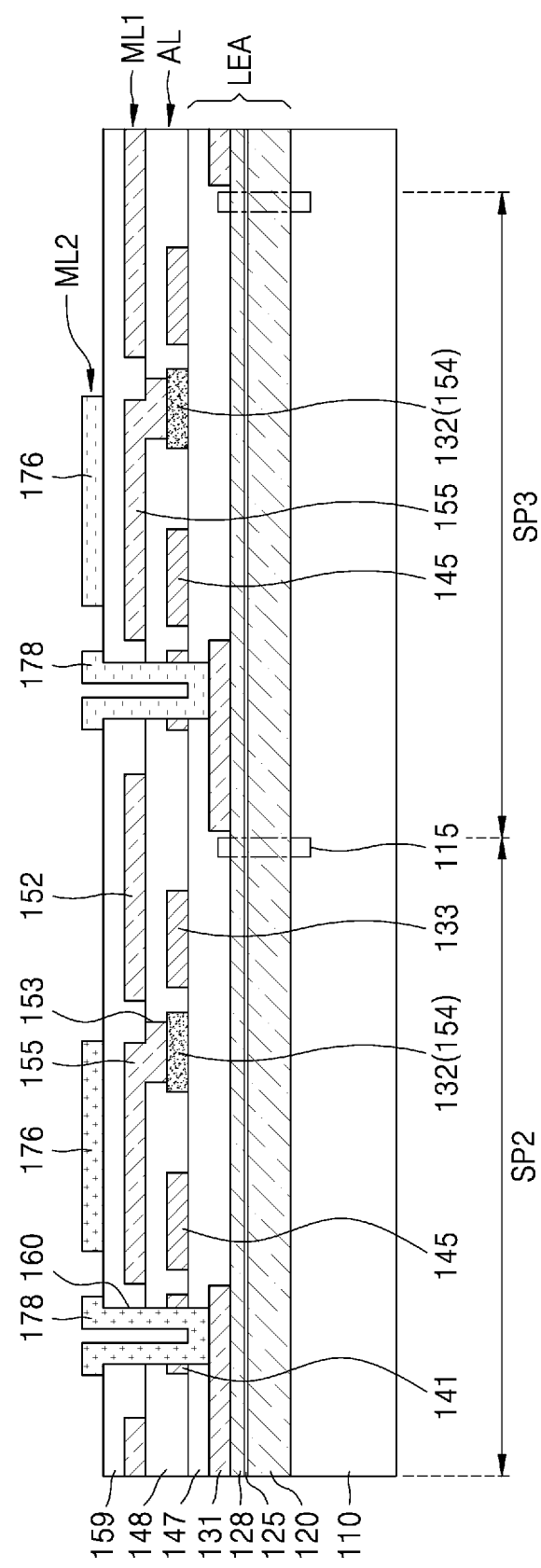
FIG. 4 is a cross-sectional view taken along line A-A of FIG. 3.

FIG. 3 illustrates a circuit layout of a micro light emitting display apparatus according to an example embodiment, and FIG. 4 illustrates two consecutive cross-sectional views taken along line A-A of FIG. 3.

The micro light emitting display apparatus may include, for example, a plurality of sub-pixels SP. A pixel may indicate a basic unit for displaying colors in a display apparatus. For example, one pixel may include a first sub-pixel that emits light of a first color, a second sub-pixel that emits light of a second color, and a third sub-pixel that emits light of a third color. Accordingly the pixel may display colors with the lights of the first to third colors. For example, the first color light may include red light, the second color light may include green light, and the third color light may include blue light. However, the colors of the light are not limited thereto. The pixel may include a plurality of sub-pixels that emit light of each color respectively. The sub-pixels may be electrically driven independently.

Referring to FIG. 3, the sub-pixel may include, for example, a first sub-pixel SP1 and a second sub-pixel SP2. The micro light emitting display apparatus may include a plurality of layers and may include circuit layouts corresponding to each layer. Referring to FIG. 4, the sub-pixel may include, for example, a second sub-pixel SP2 and a third sub-pixel SP3. According to an example embodiment, the micro light emitting display apparatus may include a micro light emitting element array LEA, an active pattern layer AL provided on the micro light emitting element array LEA, a first metal layer ML1 provided on the active pattern layer AL, and a second metal layer ML2 provided over the first metal layer ML1.

The micro light emitting element array LEA may include a plurality of micro light emitting elements provided on a substrate 110. The micro light emitting element may include a first semiconductor layer 120 provided on the substrate 110, a light emitting layer 125 provided on the first semiconductor layer 120, and a second semiconductor layer 128 provided on the light emitting layer 125. That is, the light emitting layer 125 is provided between the first semiconductor layer 120 and the second semiconductor layer 128.

The first semiconductor layer 120 may include a first-type semiconductor. For example, the first semiconductor layer 120 may include an n-type semiconductor. Alternatively, the first semiconductor layer 120 may include a p-type semiconductor. The first semiconductor layer 120 may include a III-V group n-type semiconductor, for example, n-GaN. Alternatively, the first semiconductor layer 120 may include an AlN layer or an $Al_xGa_{(1-x)}N$ ($0 \leq x \leq 1$) layer. The first semiconductor layer 120 may have a single layer structure or a multilayer structure.

The light emitting layer 125 may generate light when electrons and holes are combined with each other. The light emitting layer 125 may have a multi-quantum well (MQW) structure or a single-quantum well (SQW) structure. The light emitting layer 125 may include a III-V group semiconductor, for example, GaN. The light emitting layer 125 may have an MQW structure in which, for example, an InGaN layer and a GaN layer are alternately stacked.

The second semiconductor layer 128 may include a second-type semiconductor layer. For example, the second semiconductor layer 128 may include a p-type semiconductor layer. When the first semiconductor layer 120 is an n-type semiconductor layer, the second semiconductor layer 128 may be a p-type semiconductor layer. The second semiconductor layer 128 may include, for example, a GaN layer, an AlN layer, or an $Al_xGa_{(1-x)}N$ ($0 \leq x \leq 1$) layer. For example, a p-type dopant may include, for example, Mg, Ca, Zn, Cd, Hg, or so on.

The micro light emitting element array LEA may further include an isolation structure 115 configured to define a plurality of sub-pixels SP. The isolation structure 115 may include, for example, an ion injection region. Here, ions may include, for example, nitrogen (N) ions, boron (B) ions, argon (Ar) ions, phosphorus (P) ions or so on. Light is not emitted by preventing a current from flowing into the ion implantation region, and when the isolation structure 115 is configured as an ion implantation region, the light emitting layer 125 may be formed without a mesa structure. Alternatively, the isolation structure 115 may include an etching region that physically isolates the sub-pixels SP from each other through an etching process. In addition, the isolation structure 115 may be formed in various ways. The substrate 110 may include, for example, a silicon substrate, a glass substrate, a sapphire substrate, or a silicon substrate coated with $SiO_2$. The substrate 110 may be removed.

According to an example embodiment, a first electrode 131 may be provided on the second semiconductor layer 128. The first electrode 131 may be, for example, an anode electrode. A first insulating layer 147 may be provided on the first electrode 131.

Figure 5:
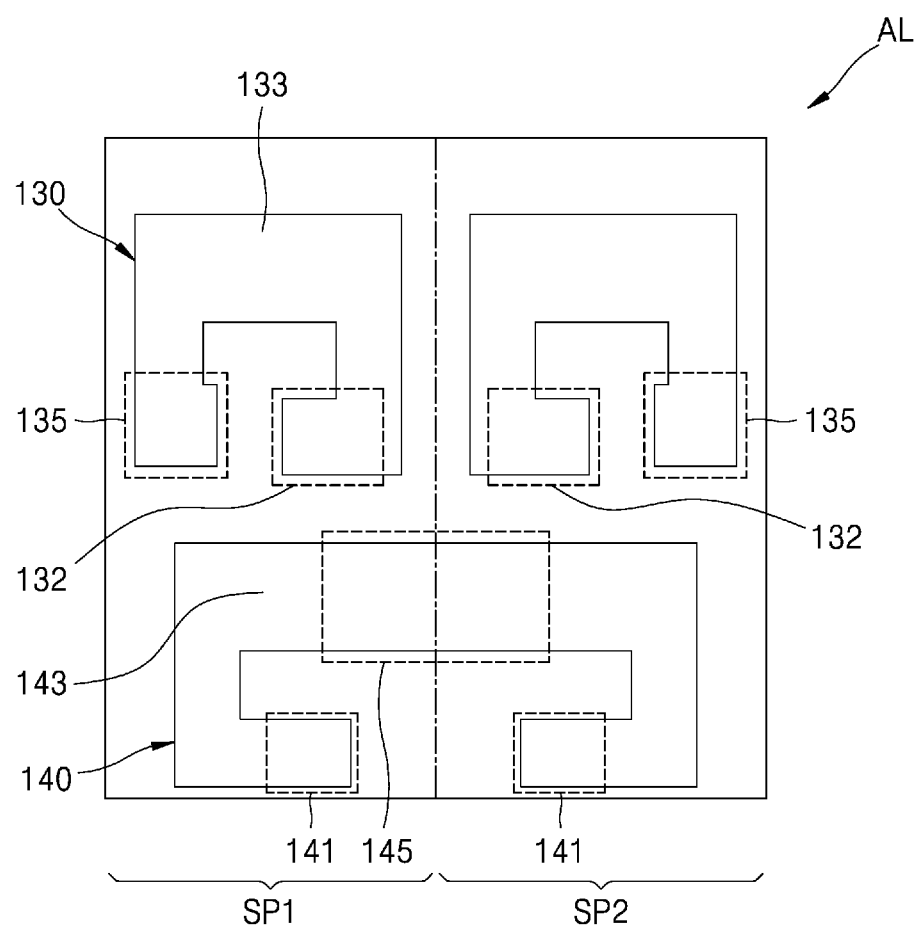
FIG. 5 illustrate a circuit layout of an active pattern layer of a micro light emitting display apparatus according to an example embodiment.
Figure 6:
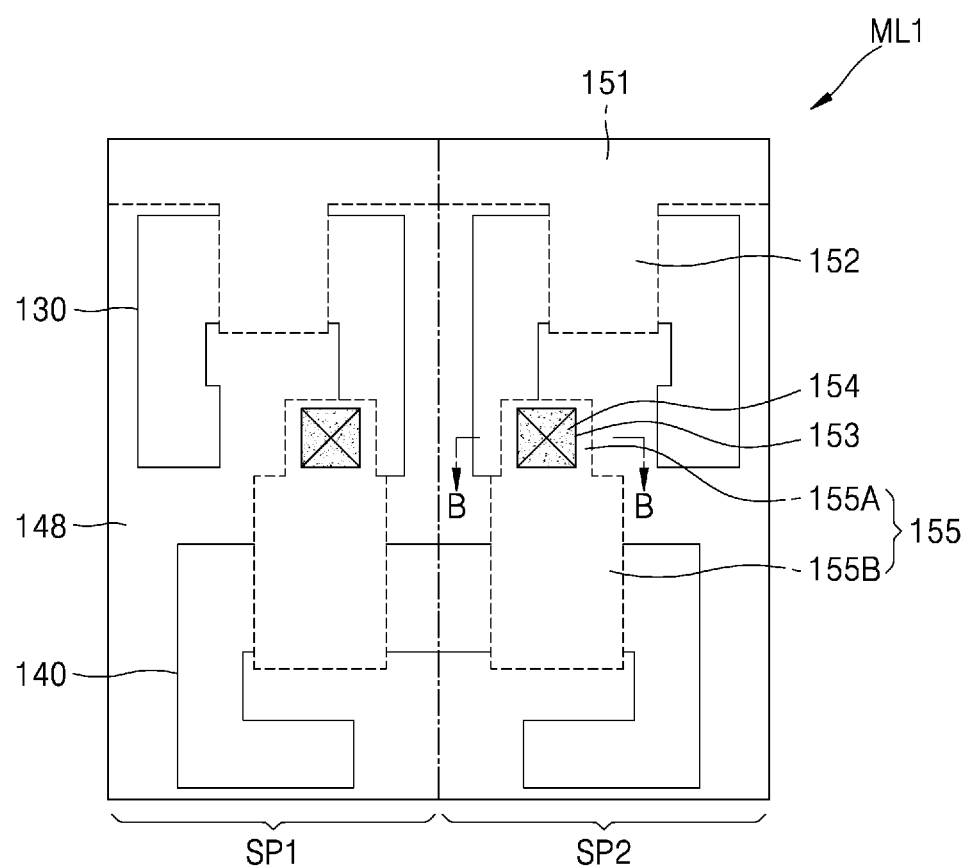
FIG. 6 illustrates a circuit layout of a first metal layer of a micro light emitting display apparatus according to an example embodiment.
Figure 8:
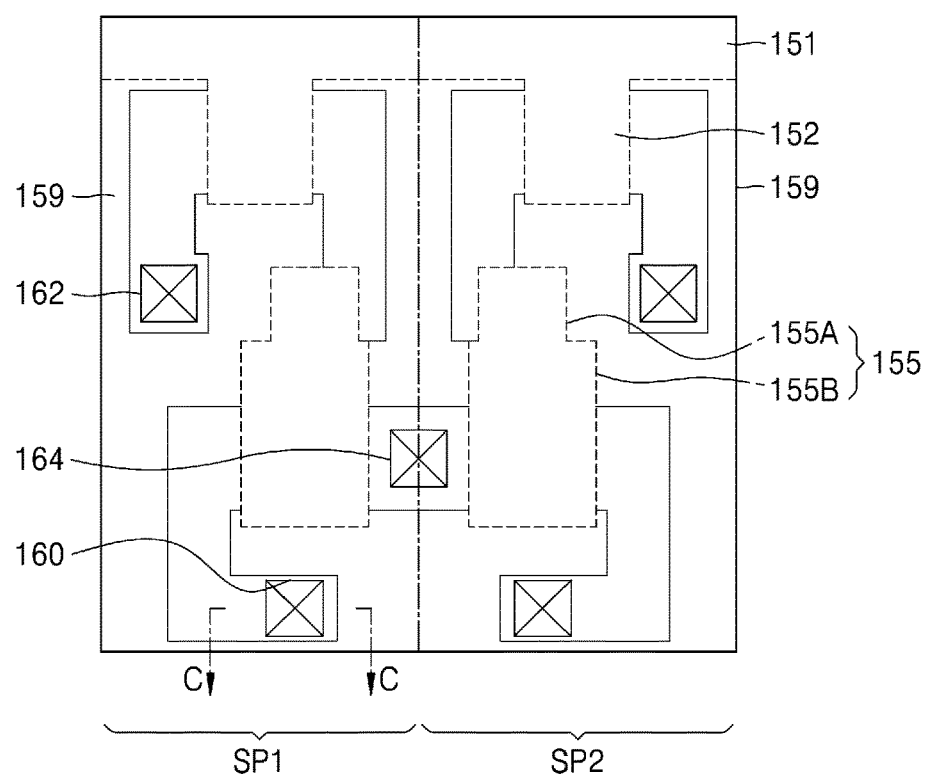
FIG. 8 illustrates a via hole structure in the first metal layer illustrated in FIG. 6.
Figure 9:
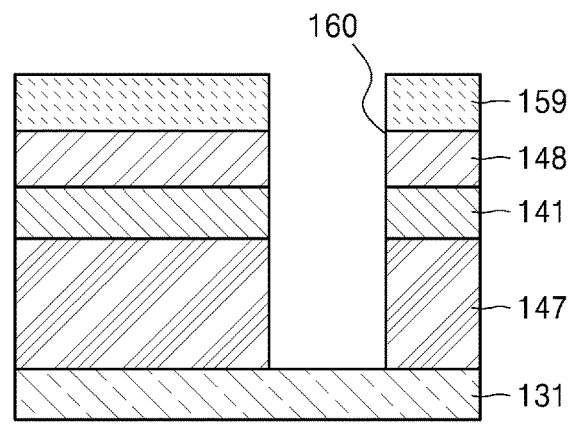
FIG. 9 is a cross-sectional view taken along line C-C of FIG. 8.
Figure 10:
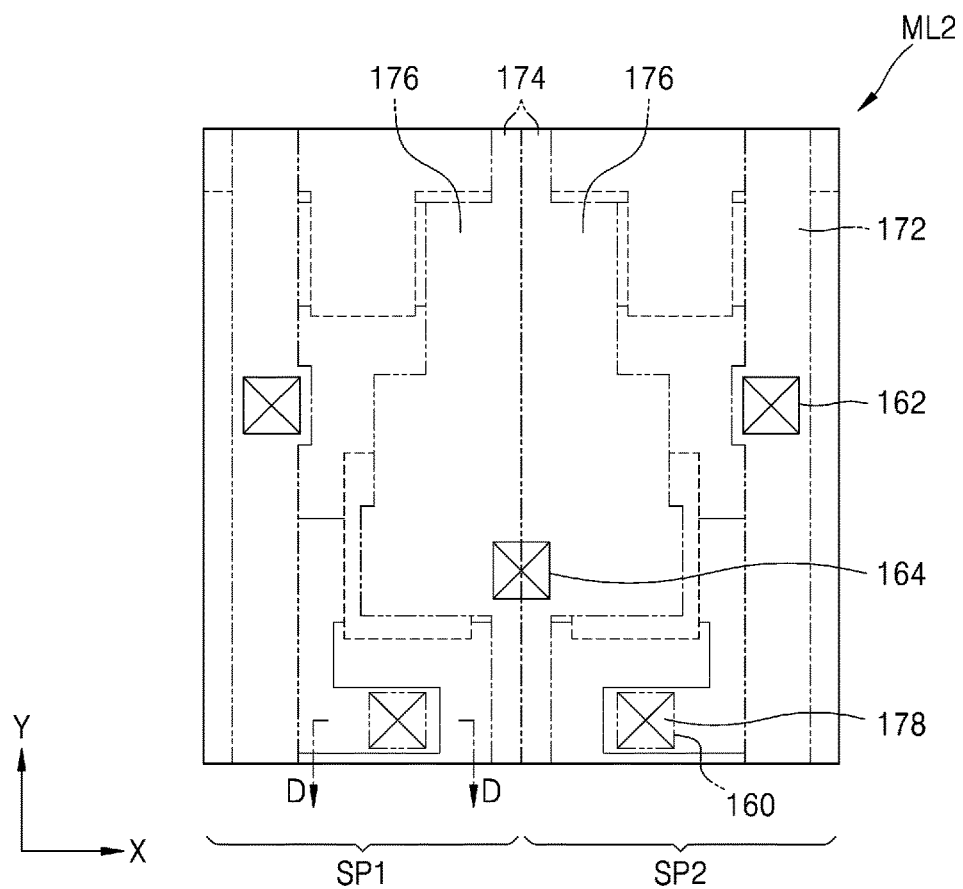
FIG. 10 illustrates a circuit layout of a second metal layer of a micro light emitting display apparatus according to an example embodiment.

FIGS. 5, 6, 8, and 10 illustrate circuit layouts of respective layers. FIG. 5 illustrates a circuit layout of the active pattern layer AL. FIG. 6 illustrates a circuit layout of the first metal layer ML1. FIGS. 8 and 9 illustrate a via hole structure that electrically connects the first metal layer ML1 to the second metal layer ML2 to be described below. FIG. 10 illustrates a circuit layout of the second metal layer ML2 provided over the first metal layer ML1.

Referring to FIGS. 3, 4, and 5, the first sub-pixel SP1 and the second sub-pixel SP2 each include the active pattern layer AL including a first active pattern 130 and a second active pattern 140. The first active pattern 130 and the second active pattern 140 may include, for example, poly silicon (p-Si).

The first active pattern 130 may include, for example, a source region 132, a channel 133, and a drain region 135 of a switching transistor (for example, T2 in FIG. 2). Positions of the source region 132 and the drain region 135 may be interchanged. The channel 133 may be a region facing a corresponding gate electrode 152 of FIG. 6 to be described below. The source region 132 and the drain region 135 represent rough regions, and the source region 132 and the drain region 135 may be defined according to an electrical connection structure.

The second active pattern 140 may include a drain region 141, a channel 143, and a source region 145 of a driving transistor (for example, T1 in FIG. 2). The channel 143 may be a region facing a corresponding gate electrode 155 of FIG. 6 to be described below. The source region 145 may be provided in common in, for example, the first sub-pixel SP1 and the second sub-pixel SP2. The first active pattern 130 and the second active pattern 140 are spaced apart from each other and may be provided in various forms.

Referring to FIGS. 4 and 6, a second insulating layer 148 may be stacked on the first active pattern 130 and the second active pattern 140. A first via hole 153 may be provided in the second insulating layer 148 so that the source region 132 of the first active pattern 130 is exposed. For example, an implantation region 154 may be further provided in the source region 132 exposed through the first via hole 153. The implantation region 154 may reduce resistance of the gate electrode 155 to be described below. The first via hole 153 may be provided before the second metal layer ML2 is formed.

The first metal layer ML1 may include a scan line 151 and the gate electrode 152 of a switching transistor. The scan line 151 and the gate electrode 152 may be connected to each other. A region of the first active pattern 130 facing the gate electrode 152 of the switching transistor may become the channel 133. Here, an example in which the scan line 151 and the gate electrode 152 are integrally formed is illustrated. The first metal layer ML1 may further include the gate electrode 155 of a driving transistor. A region of the second active pattern 140 facing the gate electrode 155 may become the channel 143. The gate electrode 155 may be provided in the first via hole 153 to be in contact with the source region (or drain region) 132 of the switching transistor. The gate electrode 155 may include a first portion 155A provided inside the first via hole 153 and a second portion 155B provided outside the first via hole 153.

Figure 7:
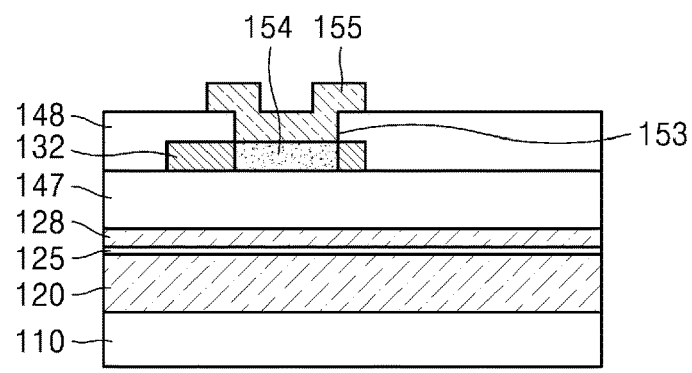
FIG. 7 is a cross-sectional view taken along line B-B of FIG. 6.

FIG. 7 is a cross-sectional view taken along line B-B of FIG. 6. Referring to FIG. 7, the implantation region 154 is provided in a region where the gate electrode 155 is in contact with the source region 132 of the switching transistor, and thereby, resistance of the gate electrode 155 may be reduced. Meanwhile, the gate electrode 155 may also correspond to a second electrode (for example, a lower electrode) of the capacitor. That is, the gate electrode 155 and the second electrode of the capacitor may be integrally formed.

Referring to FIGS. 3, 4 and 8, a third insulating layer 159 may be provided on the first metal layer ML1. A second via hole 160 may be provided in the third insulating layer 159. The first electrode 131 of the light emitting element may be exposed through the second via hole 160. In addition, a third via hole 162 and a fourth via hole 164 may be further provided in the third insulating layer 159. The drain region 135 of the switching transistor may be exposed through the third via hole 162, and the source region 145 of the driving transistor may be exposed through the fourth via hole 164.

FIG. 9 is a cross-sectional view taken along line C-C of FIG. 8. Referring to FIG. 9, the second via hole 160 may penetrate the first insulating layer 147, the second insulating layer 148, and the third insulating layer 159, and may penetrate the drain region 141 of the driving transistor to expose the first electrode 131 of the light emitting element.

FIG. 10 illustrates the second metal layer ML2. Referring to FIGS. 4 and 10, the second metal layer ML2 may include, for example, a data line 172, a drive voltage line 174, and a third electrode 176 of a capacitor. The third electrode 176 may become, for example, an upper electrode of the capacitor. In addition, the second metal layer ML2 may include a metal line 178 provided in the second via hole 160. The data line 172 may be provided on one side of each of the sub-pixels SP1 and SP2 in the Y direction in the drawing. The drive voltage line 174 may be provided in a central area where the first sub-pixel SP1 meets the second sub-pixel SP2. However, the disclosure is not limited thereto. The drive voltage line 174 may be connected to the third electrode 176 of the capacitor. Here, an example in which the drive voltage line 174 and the third electrode 176 of the capacitor are integrally formed is illustrated.

The data line 172 may be connected to the drain region 135 of the switching transistor through the third via hole 162, and the drive voltage line 174 may be connected to the source region 145 of the driving transistor through the fourth via hole 164.

Figure 11:
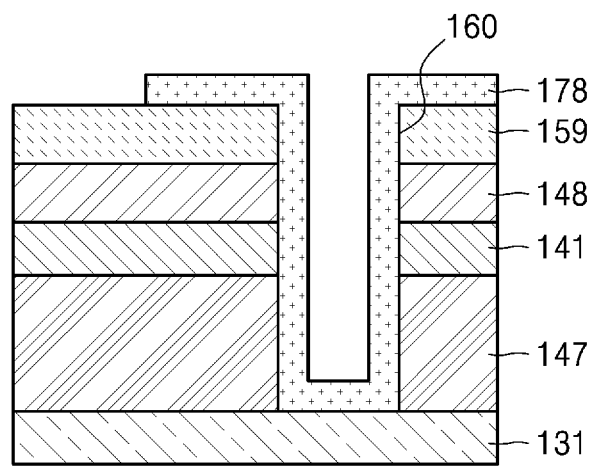
FIG. 11 is a cross-sectional view taken along line D-D of FIG. 10.

FIG. 11 is a cross-sectional view taken along line D-D of FIG. 10.

The metal line 178 may be provided in the second via hole 160. The metal line 178 may be connected to the first electrode 131 of the light emitting element. In addition, the drain region 141 may be in direct contact with a side portion of the metal line 178. Accordingly, the first electrode 131 of the light emitting element and the drain region 141 of the driving transistor may be electrically connected to each other by the metal line 178. As described above, in the example embodiment, the drain region 141 and the first electrode 131 may be connected to each other by the metal line 178 provided in one second via hole 160. Accordingly, a line and a space of a structure for connecting the drain region 141 to the first electrode 131 may be miniaturized. Accordingly, pixel per inch (PPI) may be increased.

Figure 12:
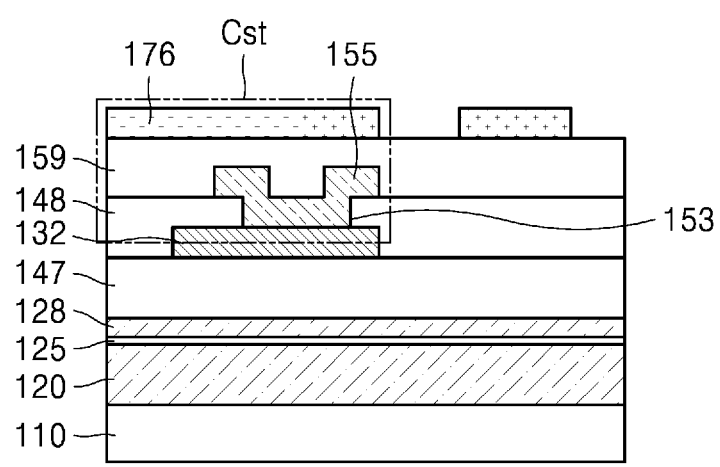
FIG. 12 illustrates a first via hole structure of a micro light emitting display apparatus according to an example embodiment.

FIG. 12 illustrates a portion in which the gate electrode 155 of the driving transistor is provided in the first via hole 153 of the micro light emitting display apparatus according to an example embodiment. On the other hand, FIG. 13 illustrates a comparative example.

Figure 13:
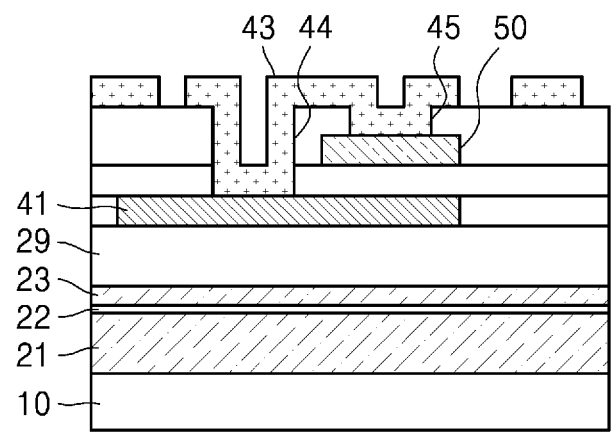
FIG. 13 illustrates a comparative example compared with the structure illustrated in FIG. 12.

According to FIG. 13, the comparative example includes a substrate 10, a first semiconductor layer 21 provided on the substrate 10, a light emitting layer 22, a second semiconductor layer 23, an insulating layer 29 provided on the second semiconductor layer 23, a source region 41 provided on the insulating layer 29, and a gate electrode 50 provided over the source region 41 to be spaced apart from the source region 41. The source region 41 and the gate electrode 50 are connected by a metal line 43 provided in a first via hole 44 and a second via hole 45.

In contrast to FIG. 13, FIG. 12 illustrates a micro light emitting display apparatus according to an example embodiment, in which, the gate electrode 155 is in direct contacts with the source region 132 through one first via hole 153, thereby reducing each line and space. The gate electrode 155 and the third electrode 176 may configure the capacitor Cst. Moreover, according to an example embodiment, because the gate electrode 155 is connected to the source region 132, an overlapping region of the first active pattern 130 of the switching transistor and the third electrode 176 may configure the capacitor Cst. The third electrode 176 of the capacitor Cst has a flat plate shape, and both an area in which the gate electrode 155 and the third electrode 176 face each other and an area in which the third electrode 176 and the first active pattern 130 face and the third electrode 176 and the second active pattern 140 face each other may configure the capacitor Cst, such that an area in which the two electrodes configuring the capacitor Cst face each other may be widened, and thus, capacitance of the capacitor Cst may be increased.

Figure 14:
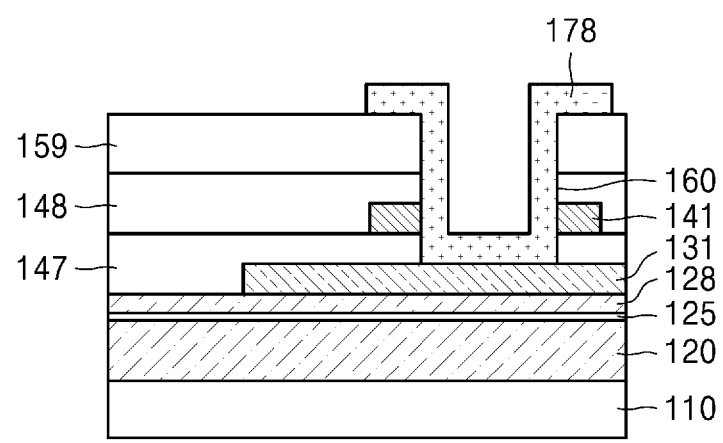
FIG. 14 illustrates a second via hole structure of a micro light emitting display apparatus according to an example embodiment.
Figure 15:
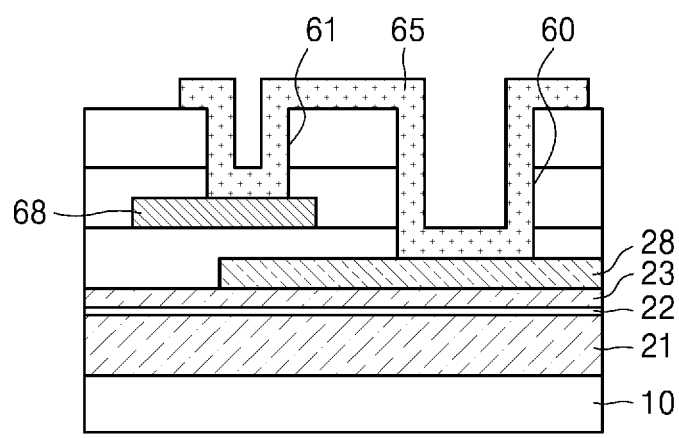
FIG. 15 illustrates a comparative example compared with the structure illustrated in FIG. 14.

FIG. 14 illustrates a portion in which the second via hole 160 of the micro light emitting display apparatus according to an example embodiment is provided. FIG. 15 illustrates a comparative example. Referring to FIG. 14, the first electrode 131 and the drain region 141 of the driving transistor may be in contact with the metal line 178 provided in one second via hole 160. In the comparative example illustrated in FIG. 15, an anode electrode 28 is connected to a drain region 68 through a metal line 65 provided in a first via hole 60 and a second via hole 61. In the comparative example, because the metal line 65 is provided in the first via hole 60 and the second via hole 61, each line and space occupies a relatively large area.

In contrast to the comparative example in FIG. 15, according to the example embodiment illustrated in FIG. 14, a connection structure between the metal line 178 and the first electrode 131 and a connection structure between the drain region 141 and the first electrode 131 are formed in one second via hole 160, thereby reducing an area of a circuit layout, and accordingly, a pixel per inch (PPI) may be increased, and resolution may be increased. In addition, under the same resolution condition, a line width margin may be increased, and when a line width is larger, relatively inexpensive manufacturing equipment may be used compared to a case in which the line width is smaller, and thus, a production cost may be reduced.

Accordingly, a light emitting element of a micro light emitting display apparatus according to an example embodiment may have a width of, for example, 200 μm or less. Alternatively, the light emitting element may have a width of 100 μm or less. A width of the light emitting element may indicate a width of a region in which light is emitted from a sub-pixel. As such, in a light emitting display apparatus using a small micro light emitting element, an area of a circuit layout may be reduced, resulting in an increase in resolution.

Next, FIGS. 16 to 26 are diagrams illustrating a method of manufacturing a display apparatus, according to an example embodiment.

Figure 16:
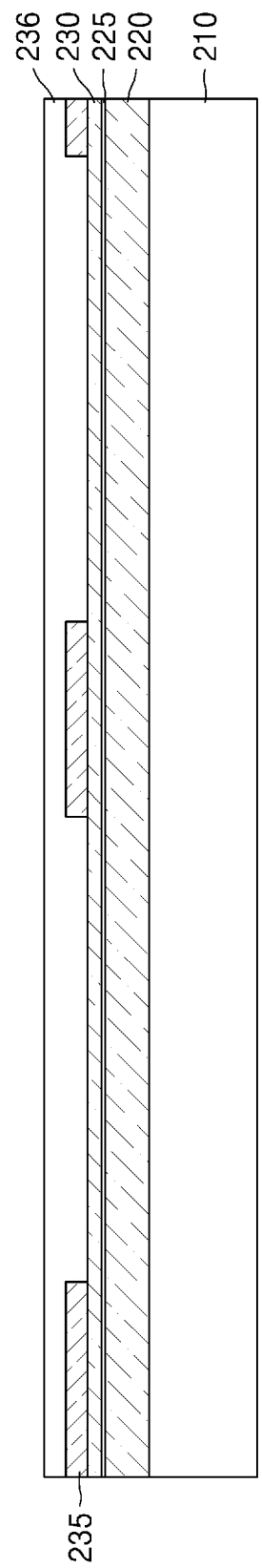
FIGS. 16 to 26 illustrate a method of manufacturing a micro light emitting display apparatus according to an example embodiment.

Referring to FIG. 16, a first semiconductor layer 220, a light emitting layer 225, and a second semiconductor layer 230 may be grown on a substrate 210. The substrate 210 may be, for example, a silicon substrate, a sapphire substrate, or a glass substrate. However, the disclosure is not limited thereto, and various epitaxial substrates may be used therefor. The first semiconductor layer 220 may include, for example, an n-type semiconductor layer. However, in some cases, the first semiconductor layer 220 may include a p-type semiconductor layer. For example, the first semiconductor layer 220 may include an n-type GaN layer.

The light emitting layer 225 may generate light when electrons and holes are combined with each other. The light emitting layer 225 may have an MQW structure or an SQW structure. The light emitting layer 225 may include a III-V group semiconductor, for example, GaN. The second semiconductor layer 230 may include a III-V group p-type semiconductor, for example, p-GaN. The second semiconductor layer 230 may have a single-layer structure or a multilayer structure.

A first electrode 235 may be formed by depositing a conductive material layer on the second semiconductor layer 230 and etching the conductive material layer. The first electrode 235 may include, for example, Ag, Au, Al, Cr, or Ni, or an alloy thereof. However, the disclosure is not limited thereto. A first insulating layer 236 is deposited on the first electrode 235.

Figure 17:
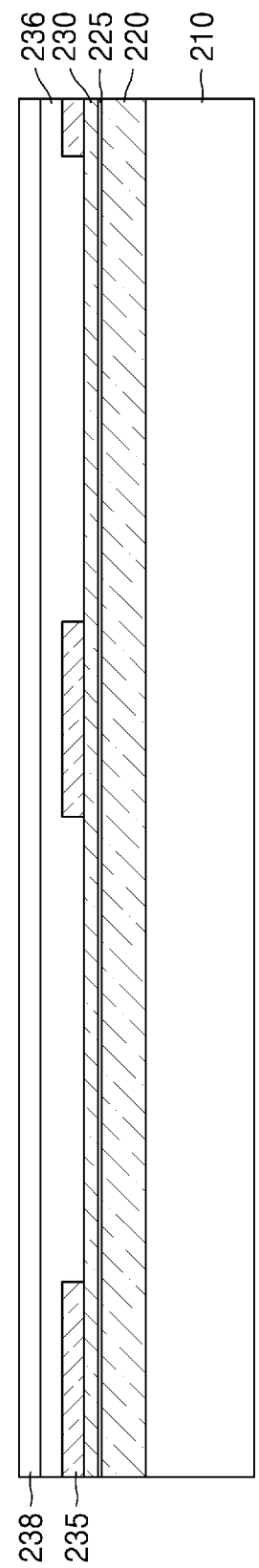
Figure 18:
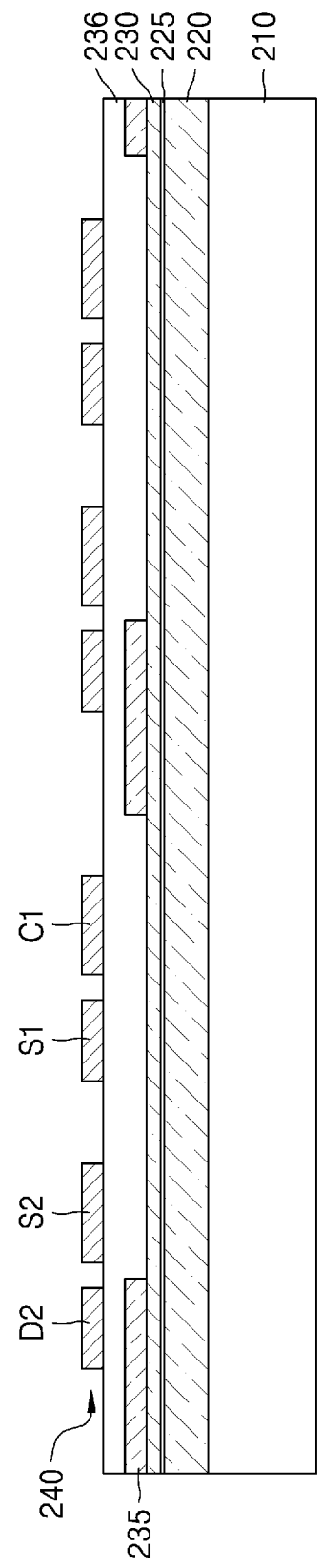

Referring to FIG. 17, a first layer 238 including a conductive material is deposited on the first insulating layer 236. Referring to FIG. 18, an active pattern layer 240 is formed by etching the first layer 238. The active pattern layer 240 may include, for example, a source region, a channel region, and a drain region of a driving transistor and may include a source region, a channel region, and a drain region of a switching transistor. Referring to FIG. 18, for example, a source region S1 and a channel C1 of a switching transistor, and a drain region D2 and a source region S2 of a driving transistor may be provided. However, the disclosure is not limited thereto, and a drain region may be formed instead of the source region S1.

Figure 19:
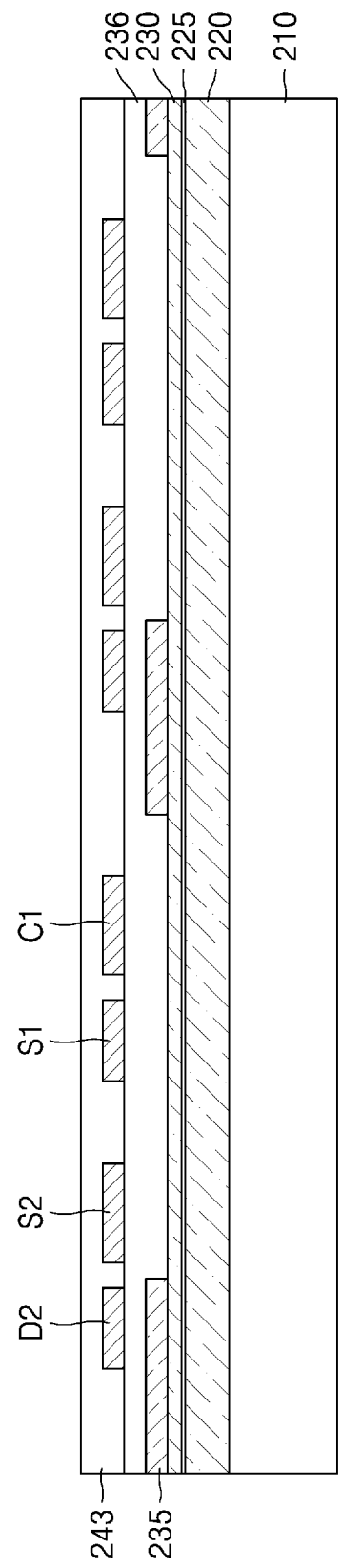
Figure 20:
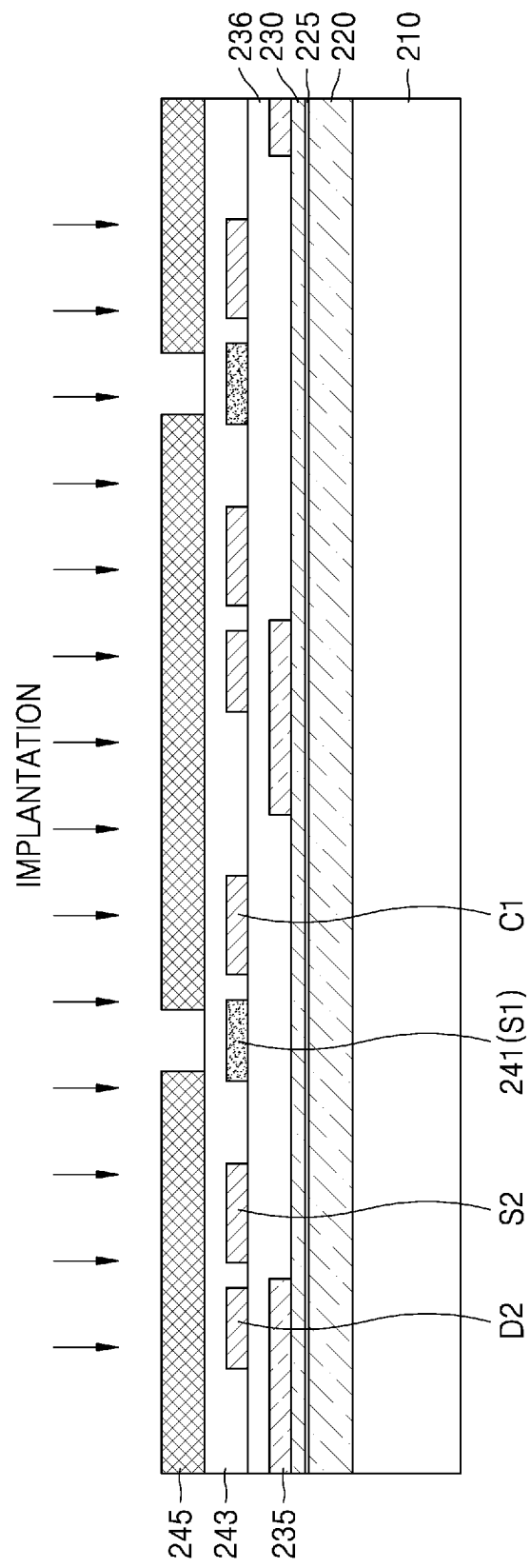

Referring to FIG. 19, a second insulating layer 243 is deposited on the active pattern layer 240. Referring to FIG. 20, an ion implantation region 241 may be formed by depositing a first photoresist layer 245 on the second insulating layer 243 and by performing ion implantation in the source region S1 (or the drain region) of the switching transistor of the active pattern layer 240 by using the first photoresist layer 245. The ion implantation region 241 may reduce resistance so that a current flows well.

Figure 21:
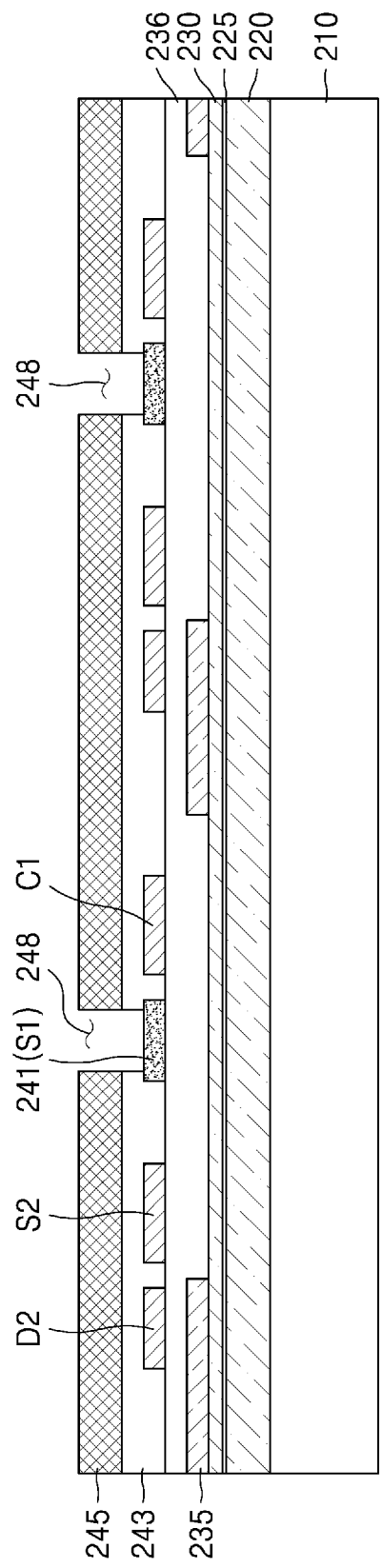

Referring to FIG. 21, a first via hole 248 is formed by etching the second insulating layer 243 by using the first photoresist layer 245. As described above, the implantation region 241 may be formed in the active pattern layer 240 to be connected to a first metal layer 253 to be described below before the first via hole 248 is formed. The implantation region 241 may be selectively formed.

Figure 22:
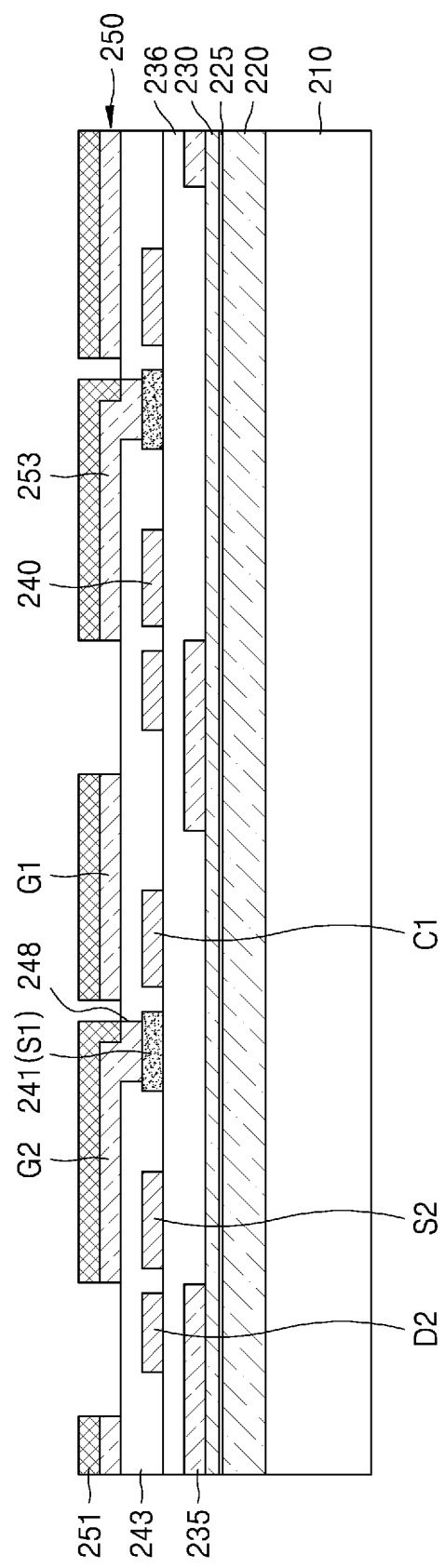

Referring to FIG. 22, the first photoresist layer 245 is removed, a second layer 250 is deposited on the second insulating layer 243, and the second layer 250 is patterned by using a second photoresist layer 251. Then, the second layer 250 is etched to form the first metal layer 253. The first metal layer 253 may include, for example, the gate electrode G1 of the switching transistor and the gate electrode G2 of the driving transistor. The gate electrode G2 of the driving transistor may be commonly used as a second electrode of capacitor. The gate electrode G2 may be in direct contact with the source region S1 through the first via hole 248. In addition, when the implantation region 241 is provided in the source region S1, the gate electrode G2 is in contact with the implantation region 241, thereby reducing gate resistance.

Figure 23:
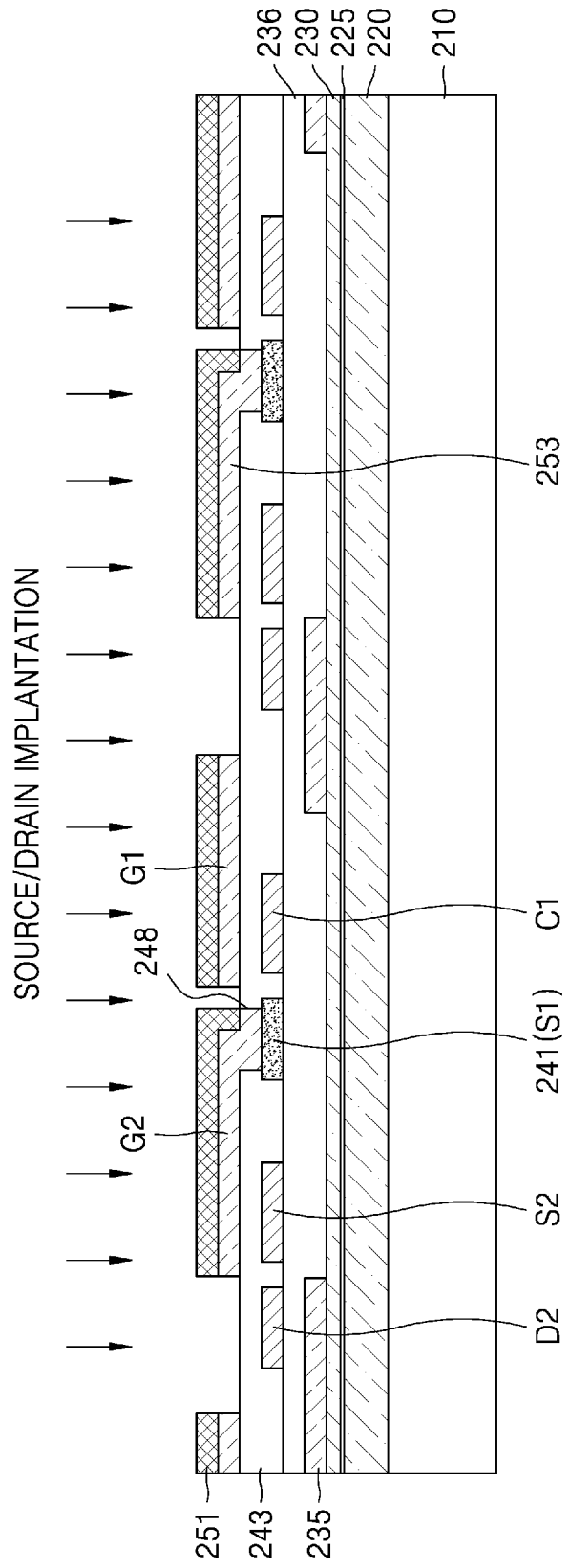

In addition, referring to FIG. 23, ion implantation may be performed in the source and drain regions by using the second photoresist layer 251.

Figure 24:
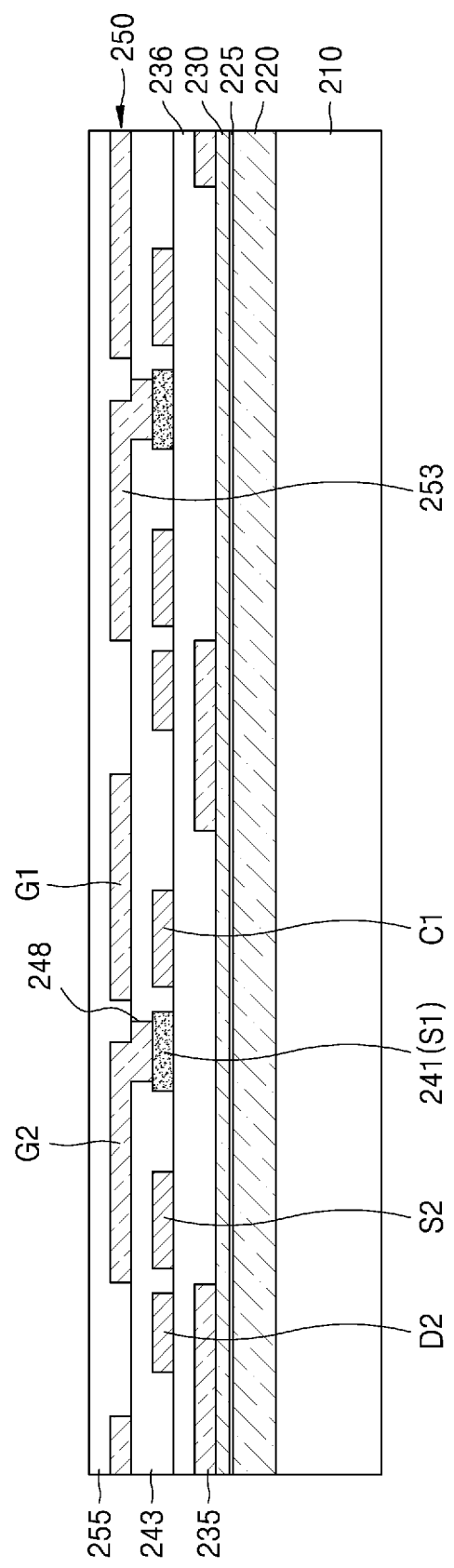

Referring to FIG. 24, the second photoresist layer 251 is removed, and a third insulating layer 255 is deposited on the first metal layer 253. The third insulating layer 255 may be, for example, an inter dielectric layer.

Figure 25:
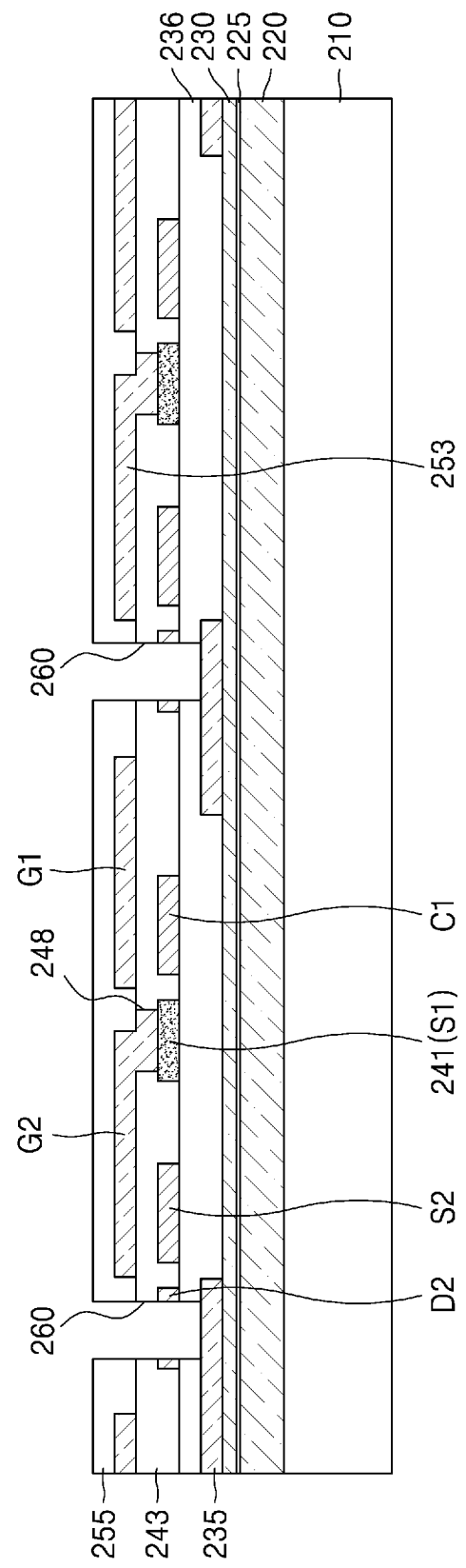

Referring to FIG. 25, the third insulating layer 255, the second insulating layer 243, the drain region D2, and the first insulating layer 236 are etched to form a second via hole 260 so that the first electrode 235 is exposed.

Figure 26:
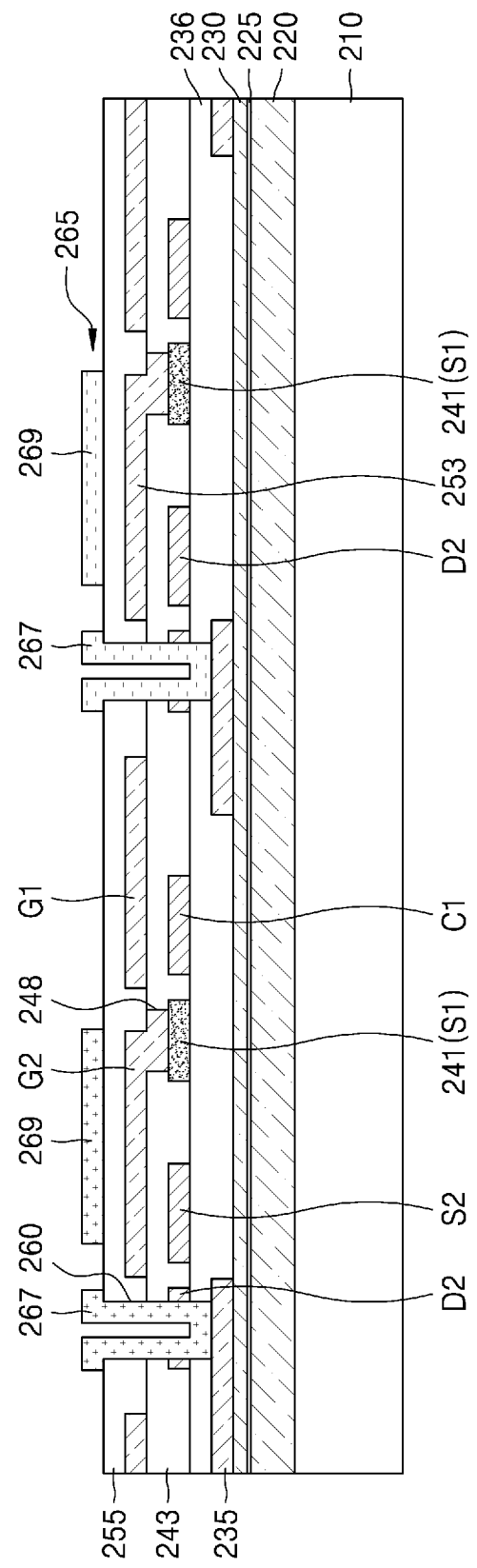

Referring to FIG. 26, a third layer is deposited on the third insulating layer 255 and the second via hole 260, and the third layer is etched to form a second metal layer 265. The second metal layer 265 may include, for example, a metal line 267 provided in the second via hole 260, and a third electrode 269 of a capacitor. The metal line 267 may be in direct contact with the drain region D2 and the first electrode 235. Because the first electrode 235 and the drain region D2 are connected to each other through one second via hole 260, each line and space may be reduced. In addition, an area in which the two electrodes configuring the capacitor face each other is wider, and thus, capacitance of the capacitor may be increased. That is, since the gate electrode G2 may be in direct contact with the source region S1 through the first via hole 248 such that the area in which the two electrodes configuring the capacitor overlap with each other is increased according to an example embodiment of the disclosure, capacitance of the capacitor may be increased accordingly.

According to a method of manufacturing a micro light emitting display apparatus according to an example embodiment, the first via hole 248 is formed before the first metal layer 253 is formed, and the gate electrode G2 is provided in the first via hole 248, and thereby, the gate electrode G2 and the source region S1 (or drain region) of the switching transistor may be in direct contact with each other. In addition, according to the method of manufacturing the micro light emitting display apparatus according to the example embodiment, an area of a capacitor is increased by forming the gate electrode G2 extending into the first via hole 248 to contact the source region S1 (or drain region) such that a region in which the two electrodes configuring the capacitor overlap with each other is widened, and thus, capacitance of the capacitor may be increased. In addition, gate resistance may be reduced by applying implantation to the source region S1 to be connected to the gate electrode G2 before the first via hole 248 is formed. In addition, each line and space may be reduced by connecting the first electrode (anode electrode) to the drain region D2 at a time through the metal line 267 provided in one second via hole 260, thereby increasing PPI.

In the example embodiment, the substrate 210 may be removed. After the substrate 210 is removed, a common electrode may be provided on the first semiconductor layer 220.

The common electrode may be formed of a transparent electrode or an opaque electrode. The transparent electrode may include, for example, indium tin oxide (ITO), zinc oxide (ZnO), indium zinc oxide (IZO), or indium gallium zinc oxide (IGZO). When the common electrode is formed of a transparent electrode, the common electrode may be arranged to cover the entire surface of the first semiconductor layer 220. When the common electrode is formed of an opaque electrode, a window region may be included in the common electrode so that light emitted from the light emitting layer 225 may pass therethrough.

Figure 27:
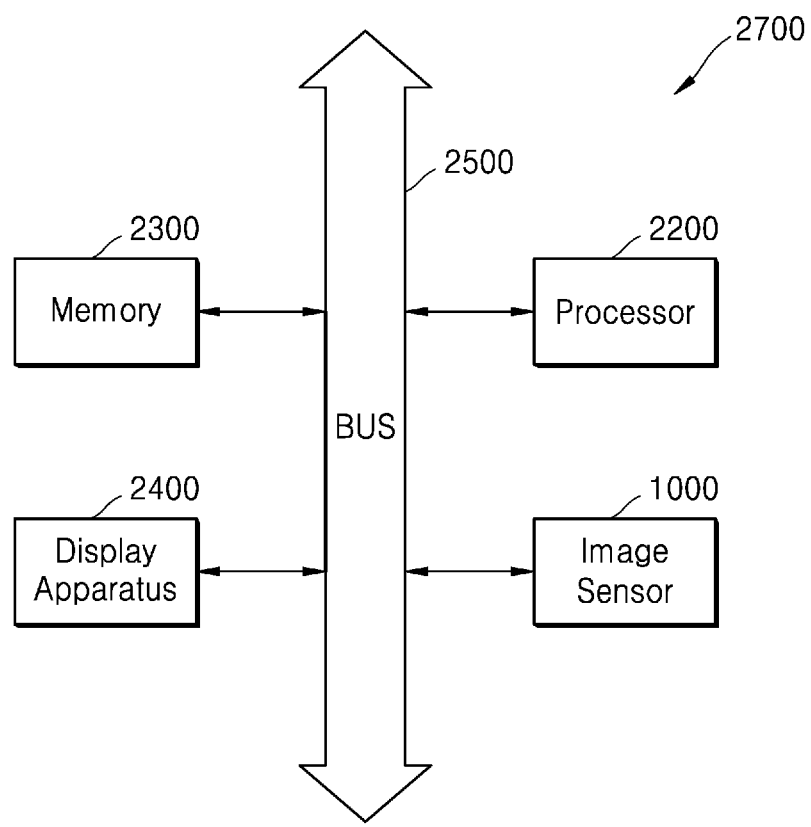
FIGS. 27 to 35 illustrate examples to which micro light emitting display apparatuses according to various embodiments are applied.

FIG. 27 is a schematic block diagram of an electronic apparatus 2700 including a display apparatus according to an example embodiment. The electronic apparatus 2700 includes an image sensor 1000, a processor 2200, a memory 2300, a display apparatus 2400, and a bus 2500. The image sensor 1000 obtains image information on an external subject and provides the image information to the processor 2200. According to an example embodiment, the image sensor 1000 obtains image information on an external subject under the control of the processor 2200 and provides the image information to the processor 2200. The processor 2200 may process the image information, which is received from the image sensor 1000. The processor 2200 may store the image information in the memory 2300 through the bus 2500. The processor 2200 may also output the image information stored in the memory 2300 to the display apparatus 2400 to be displayed to a user. In addition, as described above, the processor 2200 may also perform various types of image processing on the image information received from the image sensor 1000. Display apparatuses according to various embodiments described with reference to FIGS. 1 to 15 may be applied as the display apparatus 2400.

Figure 28:
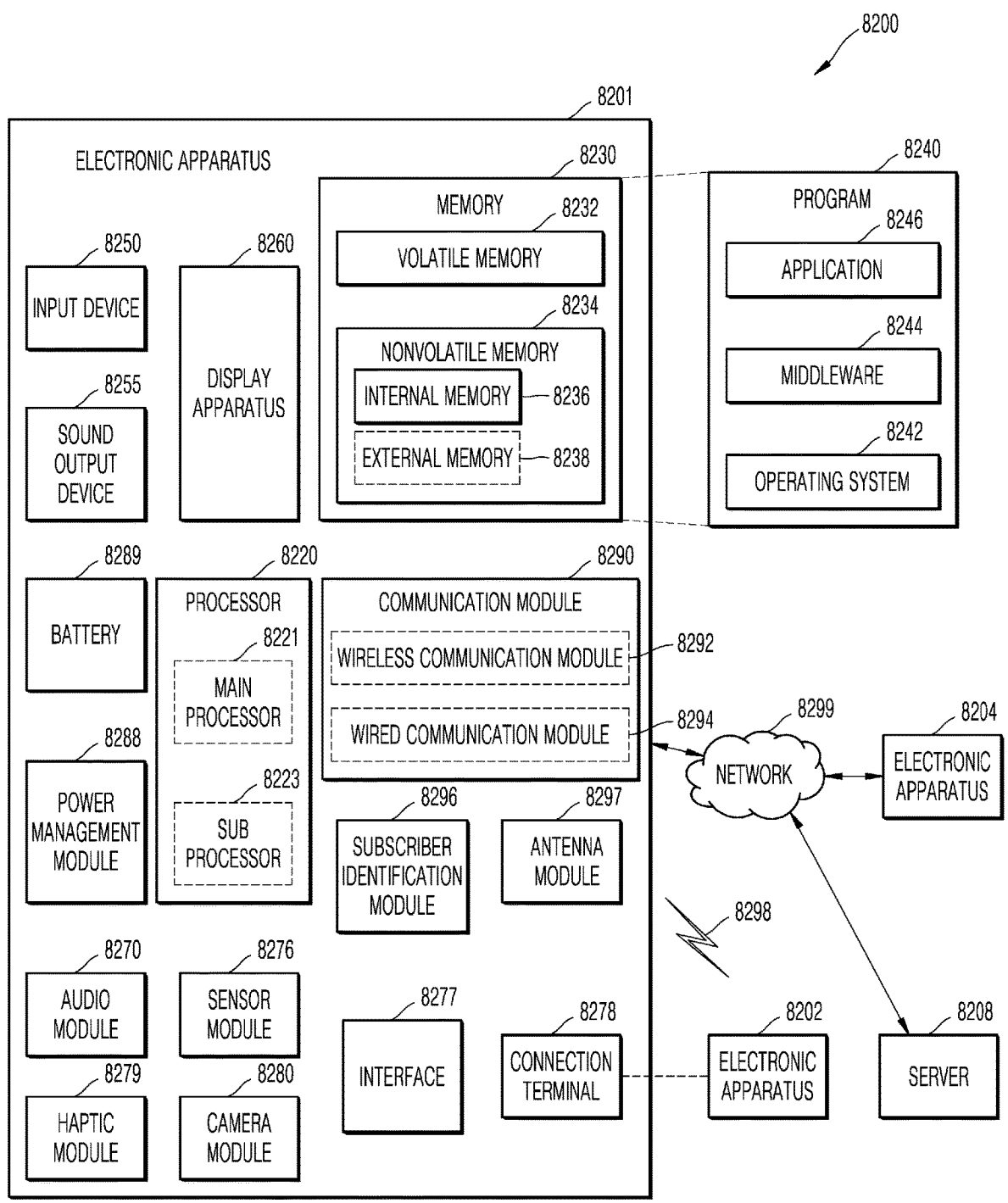

FIG. 28 is a block diagram of an electronic apparatus including a display apparatus according to an example embodiment.

Referring to FIG. 28, an electronic apparatus 8201 may be provided in a network environment 8200. In the network environment 8200, the electronic apparatus 8201 may communicate with another electronic apparatus 8202 through a first network 8298 or may communicate with another electronic apparatus 8204 and/or a server 8208 through a second network 8299. According to an example embodiment, the first network may be a short-range wireless communication network or the like, and the second network may be a long-range wireless communication network or the like. The electronic apparatus 8201 may communicate with the electronic apparatus 8204 through the server 8208. The electronic apparatus 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of the configuration elements may be omitted from the electronic apparatus 8201, or other configuration elements may be added to the electronic apparatus 8201. Some of the configuration elements may be implemented as one integrated circuit. For example, the sensor module 8276 may be embedded in the display apparatus 8260. According to an example embodiment, the sensor module may include fingerprint sensor, iris sensor, illuminance sensor, or the like. According to an example embodiment, the display apparatus may include a display or the like.

The processor 8220 may execute software (i.e., program 8240 in FIG. 28 or the like) to control one or a plurality of other configuration elements of the electronic apparatus 8201 connected to the processor 8220 and may perform various types of data processing or various types of arithmetic. According to an example embodiment, the one or the plurality of other configuration elements may be hardware configuration elements, software configuration elements, and a combination of hardware and software configuration elements or the like. The processor 8220 may load commands and/or data received from other configuration elements (i.e., sensor module 8276, communication module 8290, and the like) into a volatile memory 8232, process the commands and/or data stored in the volatile memory 8232, and store result data in a nonvolatile memory 8234, as part of data processing or arithmetic. The processor 8220 may include a main processor 8221 and a sub processor 8223 operable independently therefrom or together therewith. According to an example embodiment, the main processor 8221 may be a central processing unit, application processor, or the like, and a sub processor 8223 may be a graphic processing unit, image signal processor, sensor hub processor, communication processor, or the like. The sub processor 8223 may consume less power than the main processor 8221 and may perform specialized functions.

The sub processor 8223 may control functions and/or states related to some of the configuration elements (i.e., display apparatus 8260, sensor module 8276, communication module 8290, or the like) of the electronic apparatus

8201 instead of the main processor 8221 while the main processor 8221 is in an inactive state (i.e., sleep state), or together with the main processor 8221 while the main processor 8221 is in an active state (i.e., application execution state). The sub processor 8223 (i.e., image signal processor, communication processor, or the like) may also be provided as part of other functionally related configuration elements (i.e., camera module 8280, communication module 8290, or the like).

The memory 8230 may store various data required by configuration elements (processor 8220, sensor module 8276, or the like) of the electronic apparatus 8201. The data may include, for example, software (program 8240 or the like), input data and/or output data for commands related thereto. The memory 8230 may include the volatile memory 8232 and/or the nonvolatile memory 8234. The nonvolatile memory 8234 may include an internal memory 8236 and an external memory 8238.

The program 8240 may be stored in the memory 8230 as software and may include an operating system 8242, middleware 8244, and/or application 8246.

The input device 8250 may receive commands and/or data to be used for configuration elements (i.e., processor 8220 or the like) of the electronic apparatus 8201 from the outside (i.e., user or the like) of the electronic apparatus 8201. The input device 8250 may include a remote controller, a microphone, a mouse, a keyboard, and/or a digital pen (i.e., a stylus pen or the like).

The sound output device 8255 may output a sound signal to the outside of the electronic apparatus 8201. The sound output device 8255 may include a speaker and/or a receiver. The speaker may be used for general purposes such as multimedia playback or recording playback, and the receiver may be used to receive an incoming call. The receiver may be combined with part of the speaker or may be provided as an independent separate device.

The display apparatus 8260 may visually provide information to the outside of the electronic apparatus 8201. The display apparatus 8260 may include a display, a hologram apparatus, or a projector, and a control circuit for controlling a corresponding apparatus. The display apparatus 8260 may include the display apparatus described with reference to FIGS. 1 to 15. The display apparatus 8260 may include a touch circuitry set to sense a touch, and/or a sensor circuit (i.e., pressure sensor or the like) set to measure strength of a force generated by the touch.

The audio module 8270 may convert audio into an electrical signal or may convert an electrical signal into audio. The audio module 8270 may acquires audio through the input device 8250 or may output audio through a speaker and/or a headphone of the sound output device 8255, and/or another electronic apparatus (electronic apparatus 8202) directly or wirelessly connected to the electronic apparatus 8201.

The sensor module 8276 may detect an operation state (i.e., power, temperature, or the like) of the electronic apparatus 8201 or an external environmental state (i.e., user state or the like) and may generate an electrical signal and/or a data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic apparatus 8201 to be connected directly or wirelessly to another electronic apparatus (i.e., the electronic apparatus 8202 or the like). The interface 8277 may include a high-definition multimedia interface (HDMI), a Universal Serial Bus (USB) interface, a secure digital (SD) card interface, and/or an audio interface.

A connection terminal 8278 may include a connector through which the electronic apparatus 8201 may be physically connected to another electronic apparatus (for example, the electronic apparatus 8202). The connection terminal 8278 may include an HDMI connector, a USB connector, an SD card connector, and/or an audio connector (i.e., a headphone connector or the like).

The haptic module 8279 may convert an electrical signal into a mechanical stimulus (i.e., vibration, movement, or the like) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic apparatus 8201. The power management module 8288 may be implemented as part of a power management integrated circuit (PMIC).

The battery 8289 may supply power to configuration elements of the electronic apparatus 8201. The battery 8289 may include a non-rechargeable primary cell, a rechargeable secondary cell, and/or a fuel cell.

The communication module 8290 may establish a direct (wired) communication channel and/or a wireless communication channel between the electronic apparatus 8201 and another electronic apparatus (i.e., electronic apparatus 8202, electronic apparatus 8204, server 8208, or the like), and may support communication through the established communication channel. The communication module 8290 may operate independently of the processor 8220 (i.e., application processor or the like) and may include one or more communication processors that support direct communication and/or wireless communication. The communication module 8290 may include a wireless communication module 8292 (i.e., cellular communication module, short-range wireless communication module, global navigation satellite system (GNSS) communication module, or the like) and/or a wired communication module 8294 (i.e., Local Area Network (LAN) communication module, power line communication module, or the like). A corresponding communication module among these communication modules may communicate with another electronic apparatus through the first network 8298 (short-range communication network such as Bluetooth, WiFi Direct, or infrared data association (IrDA)) or the second network 8299 (i.e., telecommunication network such as cellular network, the Internet, or computer network (LAN, wide area network (WAN), or the like)). Various types of these communication modules may be integrated into one configuration element (i.e., a single chip or the like) or may be implemented as a plurality of separate configuration elements (multiple chips). The wireless communication module 8292 may check and authenticate the electronic apparatus 8201 in a communication network such as the first network 8298 and/or the second network 8299 by using subscriber information (i.e., international mobile subscriber identifier (IMSI) or the like) stored in the subscriber identification module 8296.

The antenna module 8297 may transmit a signal and/or power to the outside (i.e., other electronic apparatuses or the like) or may receive a signal from the outside. An antenna may include a radiator made of a conductive pattern formed on a substrate (i.e., printed circuit board (PCB) or the like). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. A signal and/or power may be transmitted or received between the communication module 8290 and other electronic apparatuses through the selected antenna. In addition to the antenna, other components (i.e., radio frequency integrated circuit (RFIC) or the like) may be included as a part of the antenna module 8297.

Some of the configuration elements may be connected to each other through a communication method (bus, general purpose input and output (GPIO), serial peripheral interface (SPI), mobile industry processor interface (MIPI), or so on) between peripheral devices and may interchange signals (i.e., commands, data, or the like).

A command or data may be transmitted or received between the electronic apparatus 8201 and the external electronic apparatus 8204 through the server 8208 connected to the second network 8299. The other electronic apparatuses 8202 and 8204 may be the same type of apparatuses as or different types of apparatuses from the electronic apparatus 8201. All or some of operations performed by the electronic apparatus 8201 may be performed by one or more of the other electronic apparatuses 8202, 8204, and the server 8208. For example, when the electronic apparatus 8201 needs to perform a function or service, the electronic apparatus may request one or more other electronic apparatuses to perform the function or part or all of the service, instead of performing the function or service by itself. One or more other electronic apparatuses that receive a request may perform an additional function or service related to the request and may transmit a performance result to the electronic apparatus 8201. To this end, a cloud computing technology, a distributed computing technology, and/or a client-server computing technology may be used.

Figure 29:
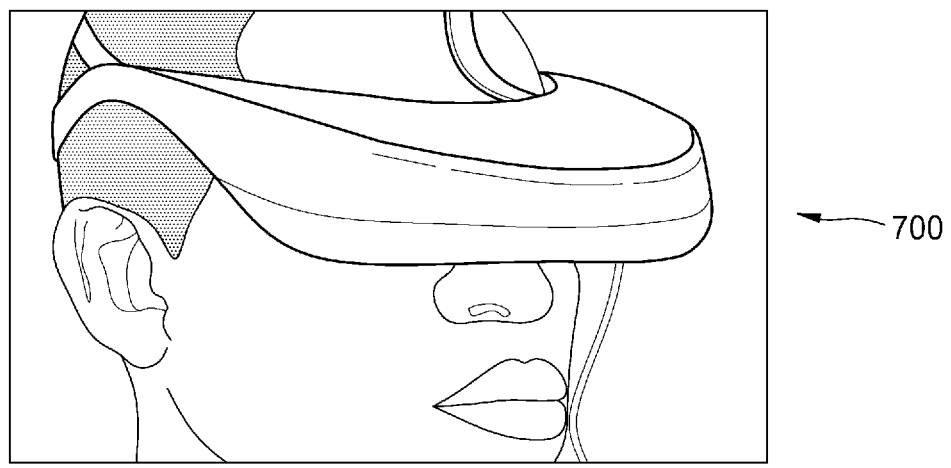
Figure 30:
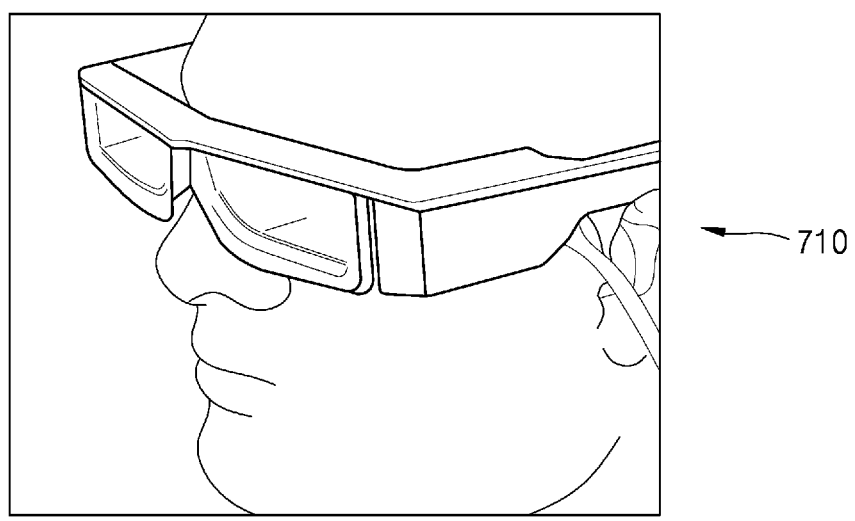
Figure 31:
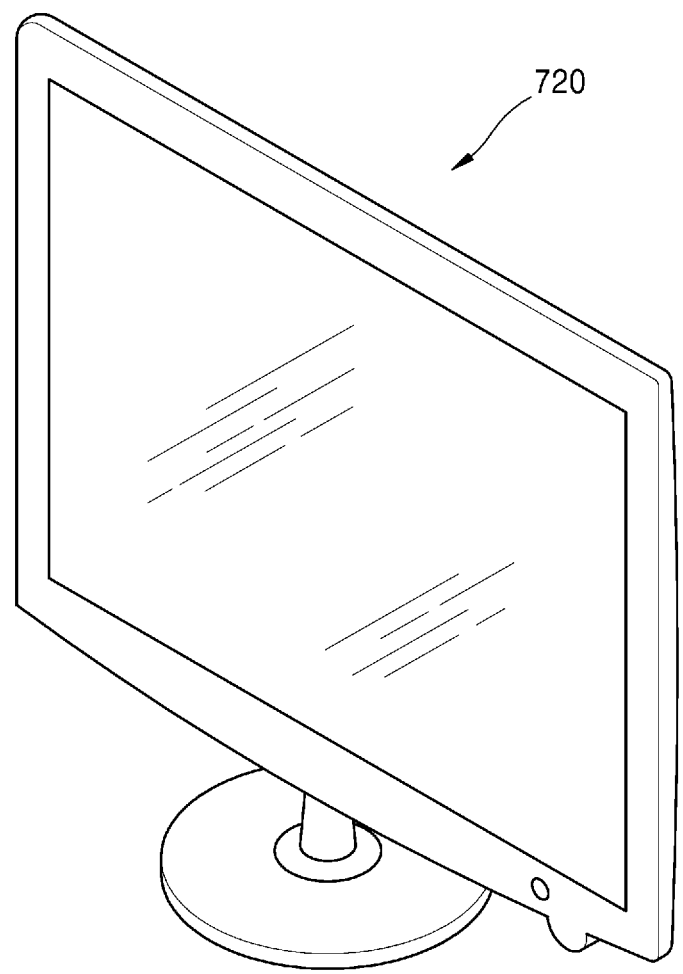
Figure 32:
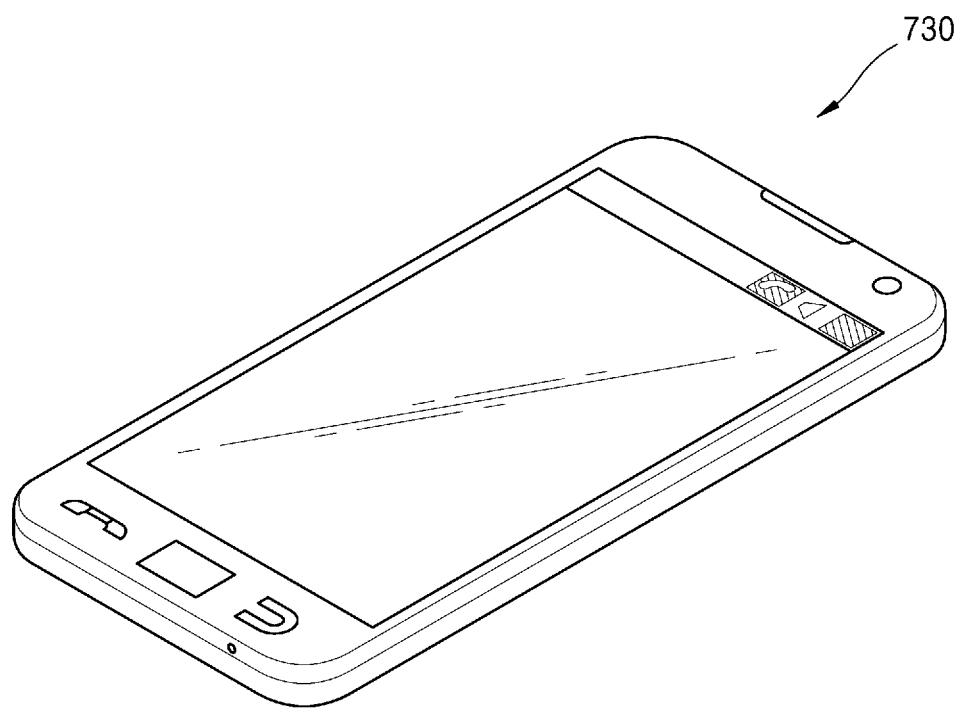
Figure 33:
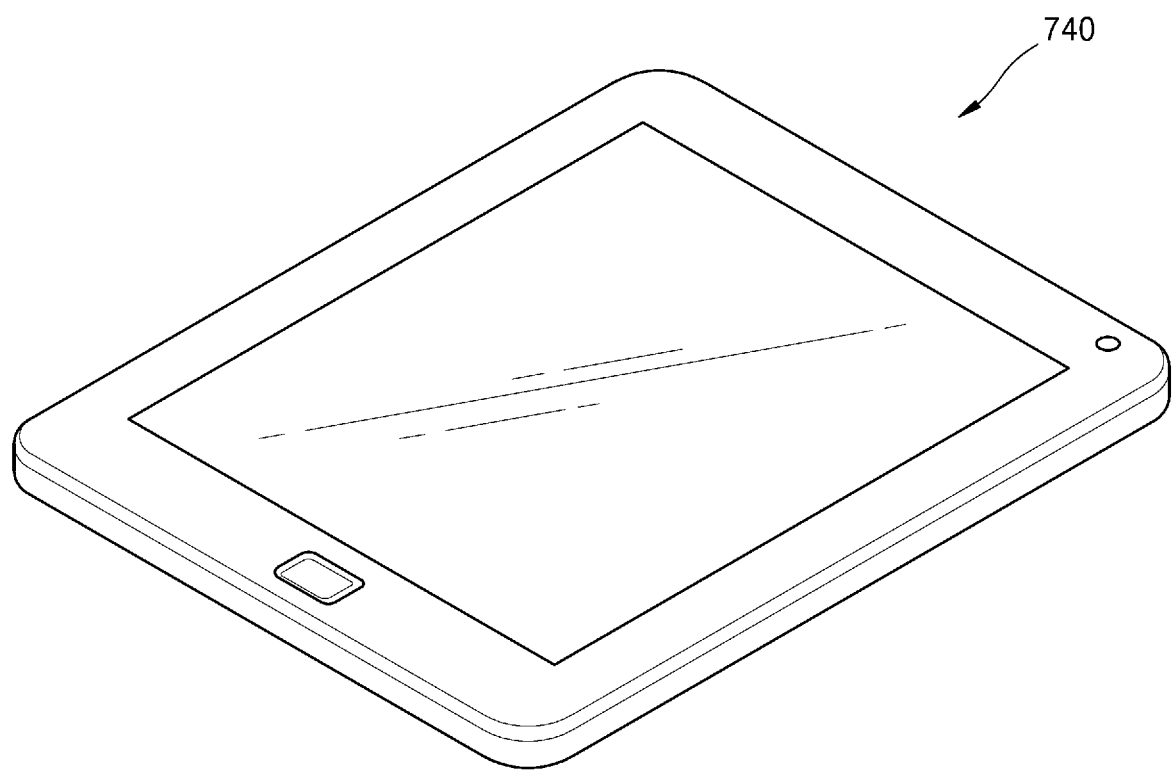

The micro light emitting display apparatus according to the above-described example embodiments may be applied to display apparatuses of various sizes and uses without limitation. For example, FIGS. 29 to 35 illustrate examples of various display apparatuses. As illustrated in FIG. 29, the micro light emitting display apparatus according to various example embodiments may be applied to a head mounted display (HMD) 700. As illustrated in FIG. 30, the micro light emitting display apparatus according to various example embodiments may be applied to a small display panel used for a glasses-type display or a goggle-type display 710. As illustrated in FIG. 31, the micro light emitting display apparatus according to various example embodiments may be applied to a display panel of a television, a smart television, or a computer 720. As illustrated in FIG. 32, the micro light emitting display apparatus according to various example embodiments may be applied to a display panel of a mobile phone or a smart phone 730. As illustrated in FIG. 33, the micro light emitting display apparatus according to various example embodiments may be applied to a display panel of a tablet or a smart tablet 740.

Figure 34:
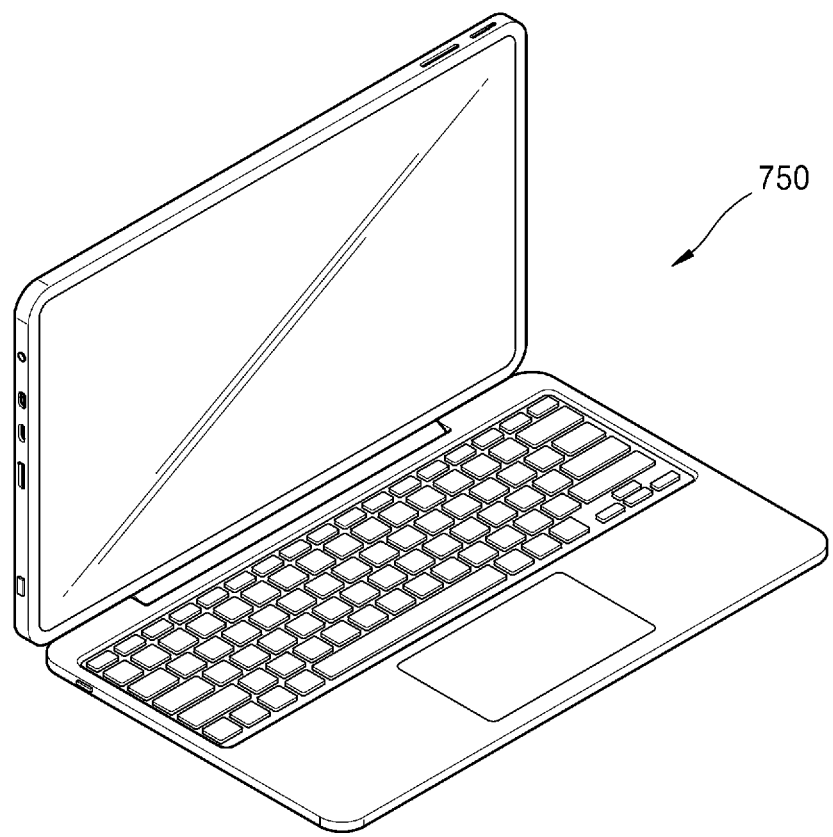
Figure 35:
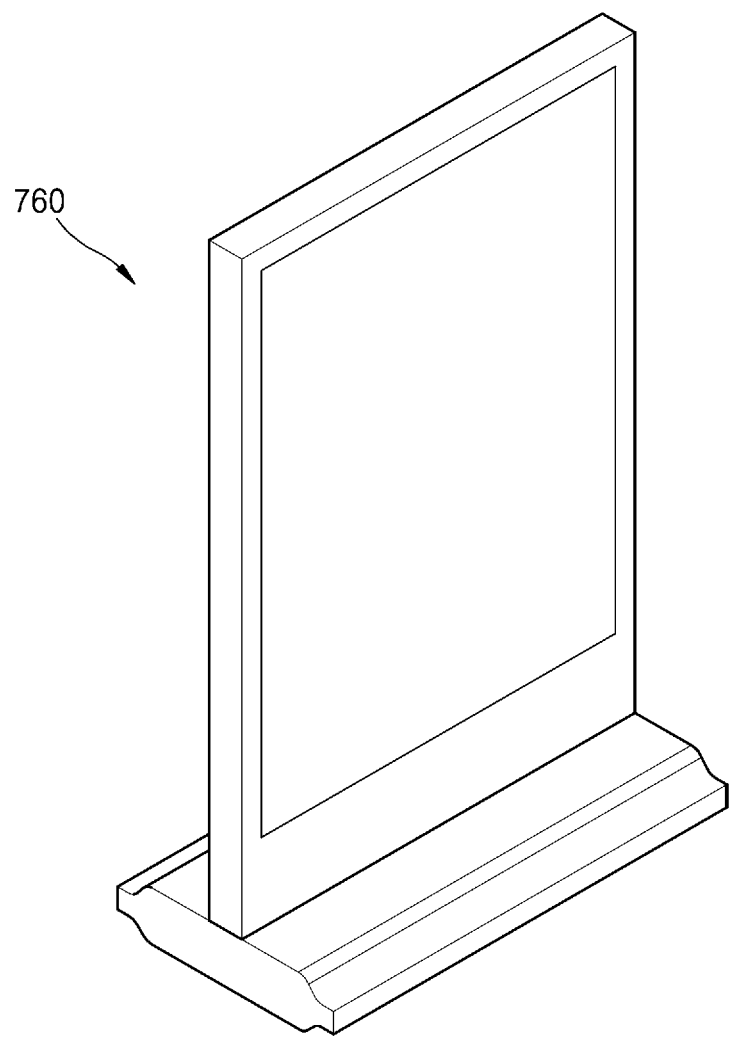

In addition, the micro light emitting display apparatus according to various example embodiments may be applied to a display panel of a notebook computer 750 illustrated in FIG. 34 and may also be applied to a large display panel used for a signage 760 illustrated in FIG. 35, a large electronic signboard, a theater screen, or the like.

Although the micro light emitting display apparatus according to various example embodiments and the method of manufacturing the same are described with reference to the embodiments illustrated in the drawings, these are only exemplary, and those skilled in the art will be appreciated that various modifications and equivalent other embodiments are possible. Therefore, the disclosed embodiments should be considered from an illustrative point of view rather than a limiting point of view. The scope of rights is represented in the claims rather than the above description, and all differences within the scope of the same should be interpreted as being included in the scope of rights.

The micro light emitting display apparatus according to the example embodiment may increase a pixel per inch (PPI) by reducing a size of a micro light emitting element. For example, PPI may be increased in the same wiring line and space. In addition, the micro light emitting display apparatus according to the example embodiment may increase capacitance of a capacitor by securing a relatively large area of the capacitor in the same sub-pixel.

The method of manufacturing the micro light emitting display apparatus according to an example embodiment may provide a method of increasing PPI.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light emitting display apparatus, comprising:
    a micro light emitting element;
    a driving transistor connected to the micro light emitting element;
    a switching transistor connected to the driving transistor;
    a capacitor connected to the driving transistor and the switching transistor;
    a first opening provided to expose a source region or a drain region of the switching transistor;
    a gate electrode of the driving transistor provided in the first opening, and in contact with the source region or the drain region of the switching transistor,
    an anode electrode provided on the micro light emitting element;
    a second opening provided to expose the anode electrode; and
    a metal line provided in the second opening,
    wherein a first end of the gate electrode of the driving transistor is provided on a source region or a drain region of the driving transistor and a second end of the gate electrode of the driving transistor is provided to physically contact the source region or the drain region of the switching transistor, and
    wherein the second opening is configured to penetrate a drain region of the driving transistor.

2. The micro light emitting display apparatus of claim 1, further comprising:
an insulating layer provided on the gate electrode of the driving transistor; and
a first electrode of the capacitor provided on the insulating layer and arranged to face the gate electrode of the driving transistor.

3. The micro light emitting display apparatus of claim 2, wherein the first electrode of the capacitor is a flat plate type electrode.

4. The micro light emitting display apparatus of claim 2, wherein the gate electrode of the driving transistor and the first electrode of the capacitor face each other and are spaced apart from each other.

5. The micro light emitting display apparatus of claim 2, wherein the gate electrode of the driving transistor is commonly provided as a second electrode of the capacitor.

6. The micro light emitting display apparatus of claim 1, wherein the source region or the drain region of the switching transistor comprises an implantation region.

7. The micro light emitting display apparatus of claim 6, wherein the implantation region is an ion implanted region.

8. The micro light emitting display apparatus of claim 1, wherein the micro light emitting element has a size of 100 μm or less.

9. The micro light emitting display apparatus of claim 1, wherein the metal line comprises a first portion provided inside the second opening and a second portion provided outside the second opening, and a drain region of the driving transistor is provided to be in contact with the first portion.

10. A micro light emitting display apparatus, comprising:
a substrate;
a micro light emitting element provided on the substrate;
an anode electrode provided on the micro light emitting element;
a driving transistor connected to the micro light emitting element;
a switching transistor connected to a gate electrode of the driving transistor;
a capacitor connected to the driving transistor and the switching transistor;
a first opening configured to expose a surface of the anode electrode; and
a metal line provided in the first opening,
wherein the first opening penetrates a drain region of the driving transistor, the metal line provided in the first opening is in contact with the surface of the anode electrode, and the drain region of the driving transistor is in contact with a side surface of the metal line.

11. The micro light emitting display apparatus of claim 10, wherein the micro light emitting element has a size of 100 μm or less.

12. The micro light emitting display apparatus of claim 10, wherein the metal line comprises a first portion provided inside the first opening and a second portion provided outside the first opening, and the drain region of the driving transistor is in contact with the side surface of the first portion of the metal line.

13. The micro light emitting display apparatus of claim 10, further comprising:
an insulating layer provided on the gate electrode of the driving transistor; and
a first electrode of the capacitor provided in the insulating layer.

14. The micro light emitting display apparatus of claim 13, wherein the first electrode of the capacitor is a flat plate type electrode.

15. The micro light emitting display apparatus of claim 13, wherein the gate electrode of the driving transistor and the first electrode of the capacitor face each other and are spaced apart from each other.

16. The micro light emitting display apparatus of claim 10, wherein a source region or a drain region of the switching transistor comprises an implantation region.

* * * * *